United States Patent
Feng et al.

(10) Patent No.: US 12,360,510 B2
(45) Date of Patent: Jul. 15, 2025

(54) LARGE SPOT SPECTRAL SENSING TO CONTROL SPATIAL SETPOINTS

(71) Applicant: Lam Research Corporation, Fremont, CA (US)

(72) Inventors: Ye Feng, Portland, OR (US); Seonkyung Lee, Santa Clara, CA (US); Rajan Arora, Portland, OR (US); Jorge Luque, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 656 days.

(21) Appl. No.: 17/659,458

(22) Filed: Apr. 15, 2022

(65) Prior Publication Data

US 2022/0334554 A1 Oct. 20, 2022

Related U.S. Application Data

(60) Provisional application No. 63/201,232, filed on Apr. 20, 2021.

(51) Int. Cl.
*G05B 19/4099* (2006.01)

(52) U.S. Cl.
CPC .......... *G05B 19/4099* (2013.01); *G05B 2219/45031* (2013.01)

(58) Field of Classification Search
CPC ...... G05B 19/4099; G05B 2219/45031; H01L 22/12
USPC ........................................ 356/237.5
See application file for complete search history.

(56) References Cited

U.S. PATENT DOCUMENTS

| | | | |
|---|---|---|---|
| 6,132,289 A | 10/2000 | Labunsky et al. | |
| 6,788,988 B1 * | 9/2004 | Pasadyn | G05B 15/02 |
| | | | 700/109 |
| 7,018,855 B2 | 3/2006 | Kota et al. | |
| 7,595,869 B1 | 9/2009 | Tian et al. | |
| 7,894,927 B2 | 2/2011 | Funk et al. | |
| 8,852,964 B2 | 10/2014 | Kimura et al. | |
| 9,245,761 B2 | 1/2016 | Singh et al. | |
| 9,752,981 B2 | 9/2017 | Lee et al. | |
| 10,032,681 B2 | 7/2018 | Bailey, III et al. | |
| 10,262,910 B2 | 4/2019 | Feng et al. | |

(Continued)

FOREIGN PATENT DOCUMENTS

| | | |
|---|---|---|
| JP | 2005536074 A | 11/2005 |
| JP | 2008091673 A | 4/2008 |

(Continued)

OTHER PUBLICATIONS

Hopper, et al., "Improved Infrared Imaging of Semiconductor Devices" Microscopy: advances in scientific research and education (A. Mendez-Vilas, Ed.) Formatex 2014, pp. 697-702.

(Continued)

*Primary Examiner* — Seung C Sohn
(74) *Attorney, Agent, or Firm* — Weaver Austin Villeneuve & Sampson LLP

(57) ABSTRACT

A large beam spot spectral reflectometer system for measuring a substrate is provided. Hardware components for collecting in situ large beam spot optical signals is disclosed. Machine learning models for denoising large beam spot optical signals are disclosed. Machine learning models for interpreting in situ optical data and facilitating process control are also disclosed.

30 Claims, 18 Drawing Sheets

(56) References Cited

U.S. PATENT DOCUMENTS

| | | | |
|---|---|---|---|
| 10,303,830 | B2 | 5/2019 | Tetiker et al. |
| 10,658,222 | B2 | 5/2020 | Yan et al. |
| 11,353,364 | B2 | 6/2022 | Thompson |
| 2003/0097198 | A1* | 5/2003 | Sonderman ............ H01L 22/20 700/121 |
| 2005/0136346 | A1 | 6/2005 | Ottens et al. |
| 2006/0247816 | A1 | 11/2006 | Prager et al. |
| 2008/0078948 | A1 | 4/2008 | Saito |
| 2009/0083013 | A1 | 3/2009 | Li et al. |
| 2011/0249115 | A1 | 10/2011 | Genest et al. |
| 2012/0253497 | A1 | 10/2012 | Prager et al. |
| 2013/0114088 | A1 | 5/2013 | Newman |
| 2014/0302681 | A1 | 10/2014 | Paterson et al. |
| 2016/0211166 | A1 | 7/2016 | Yan et al. |
| 2016/0248994 | A1 | 8/2016 | Liu |
| 2017/0109646 | A1 | 4/2017 | David |
| 2017/0133202 | A1 | 5/2017 | Berry, III |
| 2018/0150052 | A1 | 5/2018 | Cherian |
| 2019/0049937 | A1 | 2/2019 | Tetiker et al. |
| 2019/0072482 | A1 | 3/2019 | Feng et al. |
| 2019/0244870 | A1 | 8/2019 | Feng et al. |
| 2019/0311083 | A1 | 10/2019 | Feng et al. |
| 2019/0362991 | A1 | 11/2019 | Mungekar et al. |
| 2020/0110390 | A1 | 4/2020 | Banna |
| 2020/0243359 | A1 | 7/2020 | Hao et al. |
| 2020/0279066 | A1 | 9/2020 | Banna et al. |
| 2021/0035833 | A1 | 2/2021 | Feng et al. |
| 2021/0270673 | A1 | 9/2021 | Thompson |
| 2024/0047248 | A1 | 2/2024 | Talukder et al. |
| 2024/0096713 | A1 | 3/2024 | Zhang et al. |
| 2024/0255858 | A1 | 8/2024 | Feng et al. |

FOREIGN PATENT DOCUMENTS

| | | |
|---|---|---|
| JP | 2012186394 A | 9/2012 |
| JP | 2020004817 A | 1/2020 |
| KR | 101460375 B1 | 11/2014 |
| KR | 102033136 B1 | 10/2019 |
| WO | WO-2004015364 A1 | 2/2004 |
| WO | WO-2015027088 A1 | 2/2015 |
| WO | WO-2016190905 A1 | 12/2016 |
| WO | WO-2019195481 A1 | 10/2019 |
| WO | WO-2020154708 A1 | 7/2020 |
| WO | WO-2021202171 A1 | 10/2021 |

OTHER PUBLICATIONS

International Search Report and Written Opinion dated Apr. 11, 2022, in Application No. PCT/US2021/063222.

International Preliminary Report on Patentability dated Feb. 17, 2022 in PCT Application No. PCT/US2020/070384.

International Search Report and Written Opinion dated Nov. 17, 2020 issued in Application No. PCT/US2020/070384.

Kota, et al., "Advanced process control for polysilicon gate etching using integrated optical CD metrology," Proc. SPIE 5044, Advanced Process Control and Automation, Jul. 1, 2003, pp. 1-8. doi:10.1117/12.487635.

KR Office Action dated Apr. 15, 2022, in application No. KR1020170026906 with English Translation.

KR Office Action dated Oct. 22, 2021, in application No. KR10-2017-0026906 with English Translation.

NOVA Process Insights [Webpage] "Machine Learning" (2019) pp. 1-3. https://www.novami.com/nova-technology/machine-learning/ [retrieved on Jun. 5, 2019].

Stewart, M. et al., "Comprehensive Introduction to Autoencoders", Apr. 14, 2019, 24 Pages. downloaded Mar. 25, 2020 from the internet at https://towardsdatascience.com/generating-images-with-autoencoders-77fd3a8dd368.

U.S. Non Final Office Action dated Sep. 17, 2021 in U.S. Appl. No. 17/249,317.

U.S. Notice of Allowance dated Feb. 9, 2022 in U.S. Appl. No. 17/249,317.

International Preliminary Report on Patentability dated Jun. 29, 2023, in Application No. PCT/US2021/063055.

International Preliminary Report on Patentability dated Jun. 29, 2023, in Application No. PCT/US2021/063222.

International Preliminary Reporton Patentability and Written Opinion dated Dec. 14, 2023 in PCT Application No. PCT/US2022/030527.

International Search Report and Written Opinion dated Apr. 8, 2022, for International Application No. PCT/US2021/063055.

International Search Report and Written Opinion dated Sep. 15, 2022 in Application No. PCT/US2022/030527.

JP Office Action dated Oct. 18, 2022, in Application No. 2021-152896 with English translation.

KR Office Action dated Dec. 29, 2022 in Application No. KR10-2022-0086361 with English translation.

Lam Research Corporation, Previous Deployment Description, Machine Learning Models for Process Control, prior to Sep. 2018 (1 page).

* cited by examiner

| X pos | Y pos | LS Coding #1 | LS Coding #2 | LS Coding #m | Hydra duty cycle #1 | Impact #1 (as a function of Hydra to AEI distance) | Hydra duty cycle 2 | Impact #2 (as a function of Hydra to AEI distance) | Hydra duty cycle #n | Impact #n (as a function of Hydra to AEI distance) | AEI |
|---|---|---|---|---|---|---|---|---|---|---|---|
| | | | | | | | | | | | |
| | | | | | | | | | | | |
| | | | | | | | | | | | |

Figure 17

LARGE SPOT SPECTRAL SENSING TO CONTROL SPATIAL SETPOINTS

CROSS-REFERENCE TO RELATED APPLICATIONS

An Application Data Sheet is filed concurrently with the specification as part of the present application. Each application that the present application claims benefit of or priority to as identified in the concurrently filed Application Data Sheet is incorporated by reference herein in their entireties and for all purposes.

BACKGROUND

Smaller technology nodes and more complex device designs naturally introduce variations in electronic device characteristics across wafers and between wafers. Without compensation, advanced etch and deposition processes routinely produce non-uniform features across a wafer. For example, the critical dimension (CD), etch depth, etc. of an etched and/or deposited feature may vary from one position on a wafer to another. While metrology can identify non-uniformities and thereby allow process engineers to modify processing operations during production, the time spent identifying problems and determining appropriate corrections requires additional time and resources.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain aspects of the disclosure pertain to metrology systems that may be characterized by the following features: (a) a large beam spot metrology tool configured to (i) direct an incident light beam onto a wafer with a beam spot of at least about 1 mm on the wafer's surface, and (ii) detect a metrology signal from the wafer in response to illumination with the incident light beam; and (b) a control system configured to cause the metrology tool to obtain metrology samples over at least a portion of the wafer's surface. The large beam spot metrology tool may be configured to be integrated into (i) a process chamber for performing a fabrication operation on the wafer and/or (ii) a wafer handling tool configured perform an operation associated with delivering the wafer to the process chamber.

The metrology samples may comprise reflectance spectra at multiple locations on the wafer's surface. The control system may be configured to obtain metrology samples over at least about 0.5% of wafer's surface. The beam spot may have a diameter of at least about 1 mm or about 7 to 15 mm.

In certain embodiments, the control system is configured to scan the beam spot in only one dimension on the wafer's surface. In certain embodiments, the control system is configured to scan the beam spot in a radial direction with respect to the wafer's surface. In some implementations, the control system is configured to rotate the wafer while scanning the beam spot in a radial direction. In certain embodiments, the control system is configured to scan the beam spot in two dimensions on the wafer's surface. In certain embodiments, the control system is configured to control the metrology tool to sample the wafer's surface in radial and azimuthal directions. In certain embodiments, the control system is configured to step movement of the beam spot over multiple locations on the wafer's surface.

In certain embodiments, the metrology tool is configured for multiplexed capture of a plurality of metrology samples. In certain embodiments, the metrology tool is configured to be integrated in the process chamber for performing a fabrication operation on the wafer. In certain embodiments, the metrology tool is configured to be integrated in a wafer alignment tool.

The control system may be configured to scan the beam spot at rate of about 20 to 1000 degrees/second. The control system may be configured to scan the beam spot over a 300 mm wafer in about 10 to 300 seconds. The control system may be configured to flash the beam spot at a rate of about 30 to 300 flashes/second. The control system may be configured to flash the beam spot for a duration of about 1 to 10 microseconds. The control system may be configured to capture about 300 to 100,000 metrology samples on the wafer's surface. The control system may be configured to vary a density of metrology samples captured by the metrology tool as a function of position on the wafer's surface.

In certain embodiments, the position on wafer's surface is a radial position on the wafer's surface. In some implementations, the density of metrology samples is greater at the edge of the wafer's surface than at the center of the wafer's surface.

In some embodiments, the metrology system includes the process chamber. As an example, the process chamber may be an etcher. As an example, the process chamber may be a deposition tool.

In certain embodiments, the process chamber includes a position selective activation component. As an example, the position selective activation component may be a heater array in a wafer chuck. As an example, the heater array may include at least about 100 heaters.

In some implementations, the control system is configured to control sampling of the metrology tool based on information about a design layout of one or more fully or partially fabricated integrated circuits on the wafer. In some implementations, information about the design layout includes pattern locations on the wafer's surface and/or pattern orientations on the wafer's surface.

The disclosure also pertains to methods for operating metrology systems as described here.

Some aspects of the disclosure pertain to computational systems configured to denoise optical metrology data. Such computational systems may include instructions and/or data configured to implement a model that may be characterized by the following features: (a) a plurality of input nodes configured to receive spectral components of optical metrology data collected from a plurality of beam spot positions on a wafer's surface; and (b) transformation logic configured to transform the spectral components into a latent space representation of the metrology data, wherein the transformation logic was trained to reduce noise due to lithographic patterns within the beam spot positions.

In some embodiments, the model comprises a neural network or an autoencoder, such as a variational autoencoder. In certain embodiments, the input nodes are configured to receive spatial indices representing the plurality of beam spot positions on the wafer's surface. As an example, the spatial indices may indicate two-dimensional positions on the wafer's surface. As an example, the latent space representation of the metrology data may comprise the spatial indices for the latent space representation of the metrology data.

In certain embodiments, the system is further configured to transform the latent space representation to one or more spatial models of the latent space representation, wherein each spatial model presents information from the latent space representation as a function of position on the wafer's surface. As an example, the spatial models may comprise Zernike polynomials.

In certain embodiments, the transformation logic is further configured to present the latent space representation of the spectral components as information comprising a central tendency of the metrology data in each of multiple dimensions of a latent space. In certain embodiments, the input nodes are configured to receive the spectral components having a first number of dimension and wherein the latent space has a second number of dimensions, and wherein the first number of dimensions is greater than the second number of dimensions.

In some implementations, the transformation logic is configured to reduce the contribution of pattern mixing to the metrology data. In certain embodiments, the system additionally includes other input nodes configured to receive information about a design layout of one or more fully or partially fabricated integrated circuits on the wafer. In certain embodiments, the model is configured to receive information about the relative locations and/or orientations of the lithographic patterns with respect to the beam spot positions.

In some embodiments, the plurality of input nodes is configured to receive the spectral components from beam spot positions of at least about 5 mm sample on the wafer's surface.

The disclosure also pertains to computational methods for executing the transformation logic. The disclosure also pertains to computer program products comprising computer readable media on which are stored executable instructions and/or data as described for the above system.

Certain aspects of the disclosure pertain to computational systems configured to determine process settings for a fabrication apparatus. Such systems may include instructions and/or data configured to implement one or more models characterized by the following features: (a) a plurality of input nodes configured to receive a plurality of input parameter values characterizing a preprocessed wafer before the preprocessed wafer is processed in the fabrication apparatus; and (b) logic configured to computationally evaluate the plurality of input parameters and output (i) one or more process settings for the fabrication apparatus and/or (ii) a spatial distribution of one or more wafer structure parameter values over a postprocessed wafer's surface. The postprocessed wafer is the preprocessed wafer after undergoing processing in the fabrication apparatus. At least a subset of the input parameters may comprise information derived from optical metrology performed on the preprocessed wafer. The optical metrology information may comprise metrology samples collected over a portion of the preprocessed wafer's active surface.

In certain embodiments, the information derived from optical metrology comprises denoised optical metrology samples. In certain embodiments, the optical metrology comprises large beam spot optical metrology.

In certain embodiments, the information derived from optical metrology comprises a spatial model of at least one characteristic of the information derived from optical metrology. In some implementations, the at least one characteristic comprises values from a dimension of latent space from a variational autoencoder configured to denoise optical metrology samples. In some implementations, the spatial model comprises Zernike polynomials.

In some embodiments, when applied to the fabrication apparatus during processing of the preprocessed wafer, the one or more process settings produce the postprocessed wafer with a target spatial distribution of at least one of the one or more wafer structure parameter values over the postprocessed wafer's surface.

In some embodiments, at least one of the one or more models is trained using training information comprising settings of elements in a position selective activation component, and wherein data points in the training information employ only a fraction of the total elements in the position selective activation component. In some embodiments, the plurality of input parameter values comprises values specifying process settings for the fabrication apparatus during processing of the preprocessed wafer.

In certain embodiments, the plurality of input parameter values comprises settings for elements of a position selective activation component, and wherein the output of the logic comprises the spatial distribution of one or more wafer structure parameter values over a postprocessed wafer's surface. In some examples, the distribution of one or more wafer structure parameter values is predicted by the one or more models to be provided on the postprocessed wafer when the preprocessed wafer is processed using the settings for elements of a position selective activation component received at the input nodes. In some implementations, the elements of the position selective activation component are heating elements in a chuck of the process chamber, and wherein the settings are temperature values produced by the chuck during operation, and/or inputs to the elements of the position selective activation component that produce the temperature values.

In certain embodiments, the logic is further configured to identify a group of settings for the position selective activation component that will provide a target spatial distribution of wafer structure parameter values on the post processed wafer's surface. In some implementations, the logic is further configured to iteratively evaluate a cost function that compares the output spatial distribution of wafer structure parameter values on the postprocessed wafer's surface against a spatial distribution of the target wafer structure parameter values on the postprocessed wafer's surface.

In some implementations, the plurality of input parameter values comprises a spatial temperature distribution on the preprocessed wafer's surface during processing in the fabrication apparatus.

In some implementations, the system additionally includes a controller configured to apply the process settings output by the logic, directly or indirectly, to the fabrication apparatus, and processing the preprocessed wafer using the applied process conditions.

In some implementations, the postprocessed wafer comprises an actual spatial distribution of the one or more wafer structure parameter values meeting a target distribution of wafer structure parameter values on the postprocessed wafer's surface.

The disclosure also pertains to computational methods for executing the logic configured to evaluate the plurality of input parameters. The disclosure also pertains to computer program products comprising computer readable media on which are stored executable instructions and/or data as described for the above system.

These and other features of the disclosure will be presented in more detail herein with reference to the associated drawings.

BRIEF DESCRIPTION OF THE DRAWINGS

FIG. 17 illustrates a training set for supervised training of a process settings model using postprocessed wafer metrology sample values as tags for training set members, each including a collection of parameter values that may influence local wafer structure parameters and/or the associated metrology values.

DETAILED DESCRIPTION

Figure 1A:
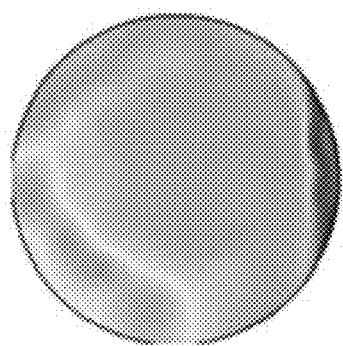
FIGS. 1A, 1B, and 1C are visualizations of within wafer non-uniformities in accordance with certain disclosed embodiments.

In the following description, numerous specific details are set forth to provide a thorough understanding of the presented embodiments. The disclosed embodiments may be practiced without some or all these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Terminology

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "semiconductor device fabrication operation" or "fabrication operation," as used herein, is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such etch process may etch a stack of layers in the substrate.

"Manufacturing equipment" or "fabrication tool" refers to equipment in which a manufacturing process takes place. Manufacturing equipment may include a processing chamber in which the workpiece resides during processing. Typically, when in use, manufacturing equipment performs one or more semiconductor device fabrication operations. Examples of manufacturing equipment for semiconductor device fabrication include subtractive process reactors and additive process reactors. Examples of subtractive process reactors include dry etch reactors (e.g., chemical and/or physical etch reactors), wet etch reactors, and ashers. Examples of additive process reactors include chemical vapor deposition reactors, and atomic layer deposition reactors, physical vapor deposition reactors, and electroplating cells.

In various embodiments, a process reactor or other manufacturing equipment includes a tool for holding a substrate during processing. Such tool is often a pedestal or chuck, and these terms are sometimes used herein as a shorthand for referring to all types of substrate holding or supporting tools that are included in manufacturing equipment.

"Metrology data" as used herein refers to data produced, at least in part, by measuring features on a semiconductor wafer. For example, features of a processed or partially processed substrate, such as a semiconductor wafer comprising partially fabricated integrated circuits. The measurement may be made before, during, or after performing a semiconductor device fabrication operation in a process chamber. In certain embodiments, metrology data is produced by a metrology system performing optical metrology on an etched substrate. Metrology performed during processing of a wafer is sometimes referred to as in situ metrology. In certain embodiments, the metrology data is produced by performing reflectometry, dome scatterometry, angle-resolved scatterometry, and/or ellipsometry on a processed or partially processed substrate.

Examples of types of optical metrology signals include values of optical intensity for light that has interacted with a substrate surface. Such light may be reflected (e.g., as by specular reflection), scattered, diffracted, refracted, etc. by the substrate surface. The optical intensity values may be provided as a function of location with respect to the substrate and/or incident light, light wavelength (e.g., for spectral data), light polarization state, and the like. The optical intensity values may be provided as a function of time. Optical metrology signals may contain information about substrate feature composition and/or geometry. Examples of geometry information include location, shape, and/or dimensions of features. Such information is often obtained from measured optical metrology signals by complicated computations such as widely used optical critical dimension (OCD) techniques. In some embodiments herein, a metrology system does not employ integrated computational processing capability for determining compositional and/or geometric information about the substrate features. Rather, such metrology systems may simply produce raw or minimally processed optical signals. For example, some such embodiments feed optical signals directly to one or more machine learning models that analyze the signals to determine processing parameters for a subsequent fabrication operation.

As explained in more detail elsewhere herein, some metrology systems may employ relatively large beam spots that can capture information over a relatively large area of the wafer surface. As examples, the beam spot size may have a diameter of about 5 mm or larger, or about 10 mm or larger.

In some embodiments, the metrology data includes "metadata" pertaining to a metrology system or conditions used in obtaining the metrology data. Metadata may be viewed as a set of labels that describe and/or characterizes the data. A non-exclusive list of metadata attributes includes:

Process Tools design and operation information such as preprocessing platform or tool design information, process recipe information, etc.

Detector details such as contrast, magnification, blur, noise, brightness, etc.

Wafers or other workpieces that have not have yet processed in a process chamber or other manufacturing equipment under consideration may be referred to as "preprocessed" wafers. Wafers or other workpieces that were previously processed in a process chamber or other manufacturing equipment under consideration may be referred to "postprocessed" wafers. A preprocessed wafer becomes a postprocessed wafer by undergoing processing in a manufacturing equipment. In some embodiments, spatially distributed metrology information obtained on preprocessed wafers is used to determine process control setting on the manufacturing equipment under consideration that will produce a target spatial distribution of structure parameter values (e.g., feature CD, pitch, and depth) on the surface of the resulting postprocessed wafer, which was previously the preprocessed wafer.

Wafer structure parameters refer to parameters of interest that characterize one or more properties of a wafer. Wafer structure parameters may be used (directly or indirectly) for controlling a particular process condition or process chamber setting. They are parameters that can be assessed using metrology. Of interest spatial variations in wafer structure parameter values may be utilized to adjust, tune, or optimize a process to achieve a target distribution of wafer structure parameter values in postprocessed wafers. In some embodiments, wafer structure parameters are parameters that can indicate whether preprocessed and/or postprocessed wafers exhibit spatial uniformity over their surfaces, including wafer-to-wafer uniformity (including wafer-to-wafer mean offset) and/or within wafer uniformity. Examples of wafer structure parameters include geometric feature parameters such as feature depth, width, sidewall angle, and overlay, as well as parameters characterizing repeating structures such as critical dimension and pitch. Examples of wafer structure parameters include physical property parameters such as the thickness of one or more layers on a wafer and dispersive properties such as refractive index and extinction coefficient of one or more layers on a wafer.

A "position selective activation component" is a process chamber component that is configured to selectively heat or otherwise stimulate regions of a wafer or other substrate in two-dimensional space. In some cases, the two-dimensions may be viewed as radial and azimuthal directions on the surface of a wafer undergoing processing in the process chamber. In some embodiments, the position selective activation component is configured to selectively heat distinct azimuthal and radial locations of a wafer. For this purpose, a wafer chuck or pedestal may include a plurality of discrete heating elements distributed in two dimensions. In other examples, a position selective activation component may be configured to selectively control plasma conditions at discrete two-dimensional regions of the wafer surface. The plasma conditions may include plasma power and/or plasma density. In certain embodiments, a position selective activation component comprises a phased array of antennas, such as microwave antennas, configured to control plasma conditions at discrete regions on a wafer's surface.

A machine learning model may be any trained computational model. In some embodiments herein, a machine learning model may receive as inputs optical metrology data reflective of feature characteristics, particularly feature geometries, substrate material properties, etc. on a substrate prior to processing in a device fabrication tool that is to be controlled using information computed by the machine learning model. Examples of machine learning models include neural networks, including recurrent neural networks and convolutional neural networks, autoencoders, including variational autoencoders, random forests models, restricted Boltzmann machines, recurrent tensor networks, and gradient boosted trees. In some embodiments herein, machine learning models are trained using a training set that reflects a range of conditions for which the model should be able to accurately predict appropriate settings for a device fabrication tool. In some embodiments herein, a machine learning model is trained using (i) raw or denoised optical metrology signals from features of a substrate that is to be processed using a particular device fabrication tool, (ii) one or more processing parameter values for processing the substrate in the device fabrication tool, and (iii) characteristics of the features after the substrate has been processed in the device fabrication tool using the one or more processing parameter values.

In general, though not necessarily, a neural network or autoencoder includes multiple layers. Each such layer includes multiple processing nodes, and the layers process in sequence, with nodes of layers closer to the model input layer processing before nodes of layers closer to the model output. In various embodiments, one layers feeds to the next, etc. The output layer may include one or more nodes configured to output information (a) representing wafer structure properties on a postprocessed wafer and/or (b) process chambers settings, such a temperature distribution on a pedestal, that are predicted to achieve a target wafer structure parameter values during wafer processing. In some implementations, a machine learning model is a model that takes metrology data and outputs a wafer structure parameter value distribution after processing, a temperature distribution for applying to a pedestal, a chuck, or other wafer holding tool during wafer processing, or other process chamber parameter values during wafer processing.

In some embodiments, the model has more than two (or more than three or more than four or more than five) layers of processing nodes that receive values from preceding layers (or as direct inputs) and that output values to succeeding layers (or the final output). Interior nodes are often "hidden" in the sense that their input and output values are not visible outside the model. In various embodiments, the operation of the hidden nodes need not be monitored or recorded during operation. The nodes and connections of a machine learning model can be trained and retrained without redesigning their number, arrangement, interface with image inputs, etc. and yet provide a correction for a mass measurement.

Noise, in general, is used herein in the manner conventionally understood in the signal processing art. In the context of this disclosure, noise may include a portion of a metrology signal that is removed by a machine learning model. Pattern mixing as an example of the kind of noise that is to be reduced or eliminated by using a machine learning model. Instrumentation error is another source of noise that may be reduced or eliminated by a machine learning model.

Introduction and Context

Although it is generally desired that wafer processing operations apply with uniform effect consistently across the entire surface of every wafer that is processed, such uniformity, of course, is not a reality. Reduction of within wafer non-uniformity (WiWNU) and wafer to wafer (W2W) variation, as well as other forms of non-uniformity, is required for advanced technology nodes. Upstream variation resulting in incoming variation is a major contributor for non-uniformity and yield loss across the wafer and between wafer runs. In some cases, non-uniformities may be anticipated to result from subsequent (downstream) processing operations. It is thus the task of the process engineer to devise effective strategies for dealing with processing non-uniformity—either, in the first instance, by preventing or minimizing it, or otherwise by compensating for it after it occurs, in some cases, at multiple stages of a processing workflow. It may require advanced process control (APC). One method to reduce variation is to obtain optical metrology data of a wafer, derive geometric features or layer compositions from the optical metrology data, and use the derived features and compositions to determine processing parameters. However, the derived features and compositions may be inaccurate approximations. Further, the derived feature information needs to be translated into process adjustments that effectively reduce variation. This may require the experience, technical expertise, and/or intuition of highly trained process engineers. Even if such engineers are available, they may require time to devise appropriate process adjustments. In some cases, even the best engineers make mistakes when proposing process adjustments.

Another method to reduce the variation noted above is utilizing incoming wafer information obtained via optical metrology and a feed forward (FF) model to directly predict a processing parameter behavior and provide a recommendation per wafer. Such a model employs optical metrology signals from pre-processed substrates as inputs. Through a machine learning prediction, a model may recommend processing parameters for a particular wafer to then be applied by the process chamber to reduce non-uniformity such as WiWNU or otherwise achieve target metrics in a postprocessed wafer. In some embodiments, the machine learning model directly or indirectly provides process parameter values such as temperature values for positions on a pedestal, that promote processing to achieve some target level of feature characteristic such as critical dimension, etch depth, pitch, etc. Setting this target level, which may be effective across all features on the wafer, intrinsically promotes uniformity.

Figure 1C:
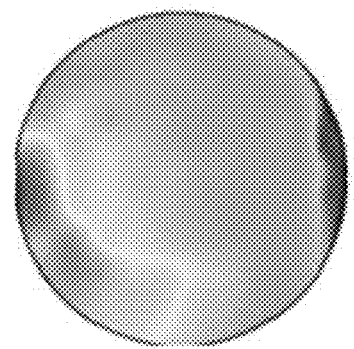
Figure 1B:
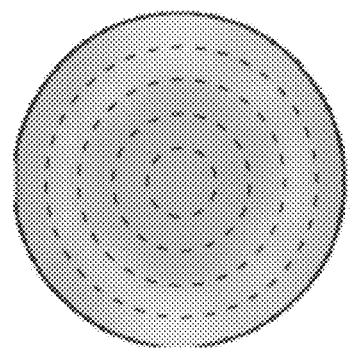

An example of within wafer non-uniformity (WiWNU) is shown in FIGS. 1A, 1B, and 1C. In particular, FIG. 1A illustrates device characteristics (e.g., critical dimension, pitch distances, etch depths, etc.) varying as a function of position within the wafer. As noted herein, wafer processing equipment may have capabilities to apply processing operations that effectively reduce WiWNU. In some implementations, some of the processing operations may be adjustable only in a radial dimension, while other processing operations may be adjustable in an x-y or radial-azimuthal coordinate system. In such implementations, it may be helpful to separate out non-uniformities that are primarily radial. In particular, it may be desirable to break down data on overall non-uniformity into a primarily radial component (as shown in FIG. 1B) and then another component that's primarily non-radial (as shown in FIG. 1C).

Fabrication Tool with Optional In Situ Metrology Component

Figure 2:
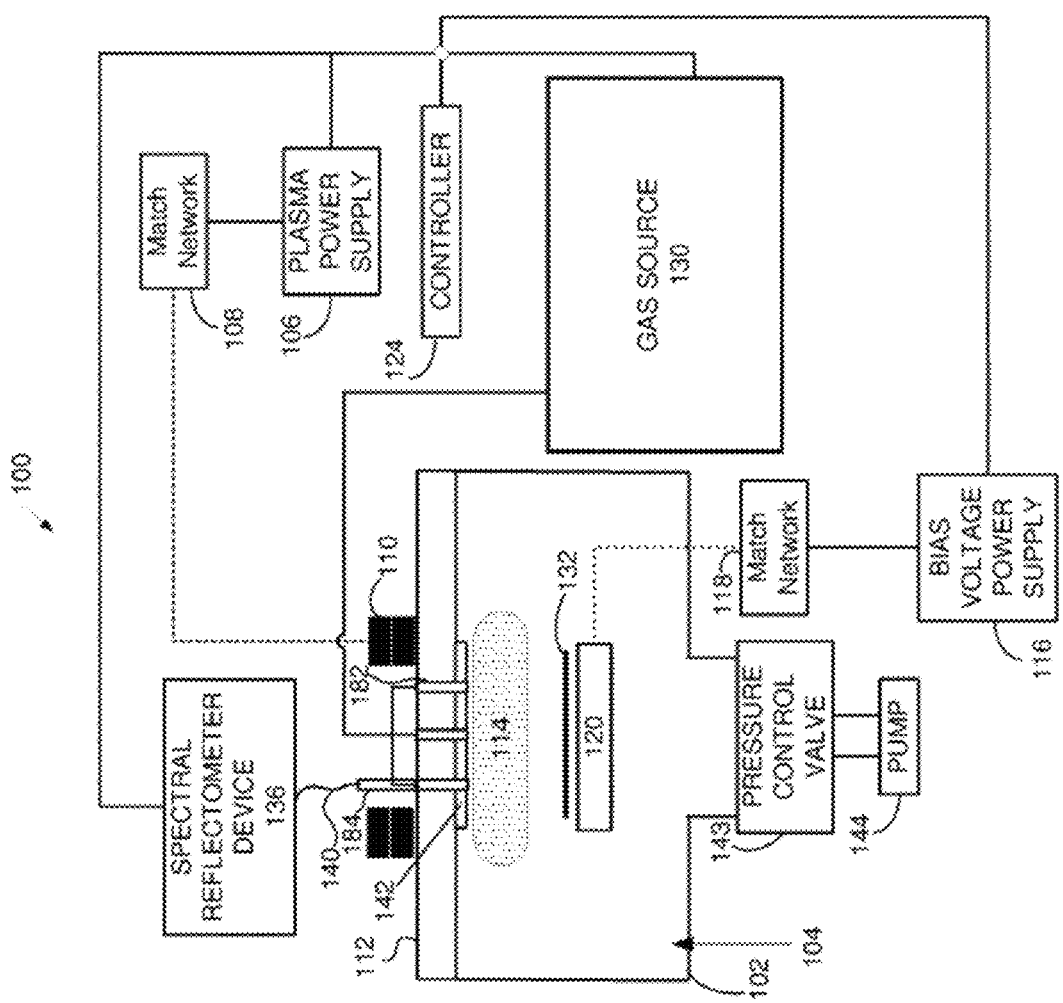
FIG. 2 schematically illustrates an example of a fabrication tool in accordance with certain disclosed embodiments.

FIG. 2 schematically illustrates an example of a fabrication tool 100 (e.g., a plasma processing system). The fabrication tool 100 includes a plasma reactor 102 having a plasma processing confinement chamber 104 therein. A plasma power supply 106, tuned by a match network 108, supplies power to a transformer-coupled-plasma (TCP) coil 110 located near a power window 112 to create a plasma 114 in the plasma processing confinement chamber 104 by providing an inductively coupled power. The TCP coil (upper power source) 110 may be configured to produce a uniform diffusion profile within the plasma processing confinement chamber 104. For example, the TCP coil 110 may be configured to generate a toroidal power distribution in the plasma 114. The power window 112 is provided to separate the TCP coil 110 from the plasma processing confinement chamber 104 while allowing energy to pass from the TCP coil 110 to the plasma processing confinement chamber 104. A wafer bias voltage power supply 116 tuned by a match network 118 provides power to an electrode in the form of a substrate support 120 to set the bias voltage on the substrate 132 which is supported by the substrate support 120. A controller 124 sets points for the plasma power supply 106, gas source/gas source 130, and the wafer bias voltage power supply 116.

The plasma power supply 106 and the wafer bias voltage power supply 116 may be configured to operate at specific radio frequencies such as, for example, 13.56 MHz, 27 MHz, 2 MHz, 60 MHz, 100 kHz, 2.54 GHz, or combinations thereof. Plasma power supply 106 and wafer bias voltage power supply 116 may be appropriately sized to supply a range of powers in order to achieve desired process performance. In addition, the TCP coil 110 and/or the substrate support 120 may be comprised of two or more sub-coils or sub-electrodes, which may be powered by a single power supply or powered by multiple power supplies.

The gas source 130 is in fluid connection with plasma processing confinement chamber 104 through gas inlets 182 in a shower head 142. The gas inlets 182 may be located in any advantageous location in the plasma processing confinement chamber 104 and may take any form for injecting gas. Preferably, however, the gas inlet may be configured to produce a "tunable" gas injection profile, which allows independent adjustment of the respective flow of the gases to multiple zones in the plasma process confinement chamber 104. The process gases and byproducts are removed from the plasma process confinement chamber 104 via a pressure control valve 143 and a pump 144, which also serve to maintain a particular pressure within the plasma processing confinement chamber 104. The gas source/gas supply mechanism 130 is controlled by the controller 124. A collimator housing 184 is connected to at least one gas inlet 182.

Tool 100 includes an optional in situ metrology component, which may be a large beam spot metrology component as described elsewhere herein. The metrology component includes an optical cable 140 that is connected between the collimator housing and a spectral reflectometer device 136. In this embodiment, the optical cable 140 comprises transmission optical fibers and receiving optical fibers and the spectral reflectometer device 136 houses, e.g., a xenon arc lamp and photodetectors. Such lamp may provide a pulsed, non-uniform beam, which may provide a large beam spot on a wafer in the chamber. The xenon arc lamp is coupled to the transmission optical fibers to provide light to the collimator housing 184. The photodetectors are coupled to the receiving optical fibers to receive reflected, which receives light reflected from the substrate 132. An embodiment of the disclosure may be used with a Kiyo® and Flex® by Lam Research Corp. of Fremont, Calif. and with other substrate processing systems.

Spatially Controlling Wafer Processing Through Position Selective Process Control In some embodiments, a fabrication tool may control processing non-uniformity by varying temperature, plasma conditions, or other processing parameters spatially and/or temporally over the surface of a wafer undergoing processing. For convenience, most examples herein will reference spatially varying temperature control. As an example, a fabrication tool may have a wafer support assembly with independently controllable temperature control zones. The temperature control zones may provide for a controllable temperature profile during fabrication operations, with the temperature profile being controllably shaped both radially and azimuthally (or in an x-y coordinate system). The temperature control zones can be arranged in a defined pattern, such as, a rectangular grid, a hexagonal grid, or other suitable pattern for generating a temperature profile as desired. Each temperature control zone can be of a suitable size for generating a temperature profile with the desired spatial granularity. Additional details and examples of fabrication tools having a wafer support assembly with independently controllable temperature control zones are disclosed by U.S. Pat. No. 8,852,964, issued Oct. 7, 2014, which is hereby incorporated by reference in its entirety.

Each temperature control zone may include one or a plurality of temperature control elements. Power supplied to the temperature control elements of each temperature control zone 304 may be smaller than about 20 W, for example, or within a range of about 5 to 10 W. The temperature control elements may be Peltier devices and/or resistive heaters such as polyimide heaters, silicone rubber heaters, mica heaters, metal heaters (e. g. W, Ni/Cr alloy, Mo or Ta), ceramic heaters (e. g. WC), semiconductor heaters, carbon heaters, or any other suitable type of heating or cooling element as desired. The temperature control elements may be implemented in various designs or configurations, such as being screen printed, wire wound, etched foil heaters, or any other suitable design as desired. The thickness of the temperature control elements may range from about 2 micrometers to 1 millimeter, or within a range of about 5-80 micrometers. In certain embodiments, to allow space between temperature control zones and/or power supply and power return lines, the total area of the temperature control zones can be up to about 90% of the area of the upper surface of the wafer support assembly, e.g. about 50-90% of the area. The power supply lines or the power return lines (power lines, collectively) can be arranged in gaps ranging from about 1 to 10 mm between the temperature control zones, or in separate planes separated from the temperature control zones plane by electrically insulating layers.

In certain embodiments, a fabrication tool having independently controllable temperature control zones may have any desired number of temperature control zones of any desired size. It may further be desirable to have a large number of temperature control zones packed tightly together, in order to increase and/or maximize the ability to vary temperature parameters spatially and/or temporally. Additionally, it is recognized that the various components involved in fabrication, including components of the fabrication tool and the wafer being processed, have thermal mass and thus thermal resistivity. As a result, there are limits to the effectiveness of increasing the number and density of temperature control zones, as tightly packing the temperature control zones only increases, for each zone, the thermal contributions of adjacent zones. Additionally, it is recognized that achieving a desired thermal profile within a wafer may require heating the temperature control zones in a coordinated manner, given that the thermal influence of a single temperature control zone can extend into regions of the wafer associated with adjacent temperature control zones. In other words, thermal conduction between individual thermal control zones, and through the wafer, should be considered.

In certain embodiments, a wafer may be rapidly heated and its temperature is precisely controlled using, in part, visible light emitted from light emitting diodes (LEDs) (e.g., positioned in a pedestal under the wafer, positioned above the wafer, and/or to the side of the wafer). Thus, in some embodiments, the temperature control elements are light sources such as light emitting diodes (LEDs). The visible light may have wavelengths that include and range between 400 nanometers (nm) and 800 nm. The pedestal may include various features for enabling wafer temperature control, such as a transparent window that may have lensing for advantageously directing or focusing the emitted light, reflective material also for advantageously directing or focusing the emitted light, and temperature control elements that assist with temperature control of the LEDs, the pedestal, and the chamber. The fabrication too may also thermally isolate, or thermally "float," the wafer within the processing chamber so that only the smallest thermal mass is heated, the ideal smallest thermal mass being just the substrate itself, which enables faster heating and cooling. In some instances, the fabrication tool also includes temperature control elements within the processing chamber walls, pedestal, and top plate (or other gas distribution element), to enable further temperature control of the wafer and processing conditions within the chamber, such the prevention of unwanted condensation of processing gases and vapors.

A fabrication tool may also be configured to implement various control loops to precisely control the wafer and the chamber temperatures (e.g., with a controller configured to execute instructions that cause the apparatus to perform these loops). This may include the use of various sensors that determine wafer and chamber temperatures as part of open loops and feedback control loops. These sensors may include temperature sensors in the wafer supports which contact the wafer and measure its temperature, and non-contact sensors such as photodetectors to measure light output of the LEDs and a pyrometer configured to measure the temperature of different types of wafers.

Additional details and examples of fabrication tools having temperature control elements, which may be implemented via light sources, are disclosed by U.S. Provisional Patent Application No. 63/003,474, filed Apr. 1, 2020, which is hereby incorporated by reference in its entirety and for all purposes.

In some embodiments, a fabrication tool may be configured to process wafers in a spatially selective manner by spatially varying plasma conditions. As an example, a fabrication tool may be configured to selectively deliver variable plasma conditions to different regions of the substrate in two dimensions. As an example, a process chamber may include a phased array of antennas configured to control local plasma conditions on the substrate surface (e.g., as a function of radial position and/or as a function of radial and azimuthal position). Additional details and examples of fabrication tools configured to vary plasma conditions are disclosed by U.S. patent application Ser. No. 14/936,437, which is hereby incorporated by reference in its entirety and for all purposes.

As another example of spatially varying plasma conditions, a fabrication tool may include an actuated ring surrounding a wafer being processed, and the actuated ring can be configured to reduce and/or minimize effects of radiofrequency coupling discontinuities at the edge of the wafer. The actuated ring may be raised and lowered relative to a pedestal (e.g., relative to the wafer), thereby modifying process conditions at the radially outer edge of the wafer. Additional details and examples of fabrication tools configured to vary plasma conditions with an actuated ring are disclosed by U.S. Pat. No. 10,658,222 and U.S. patent application Ser. No. 14/705,430, which is hereby incorporated by reference in its entirety and for all purposes.

In Situ Reflectometer

Figure 3:
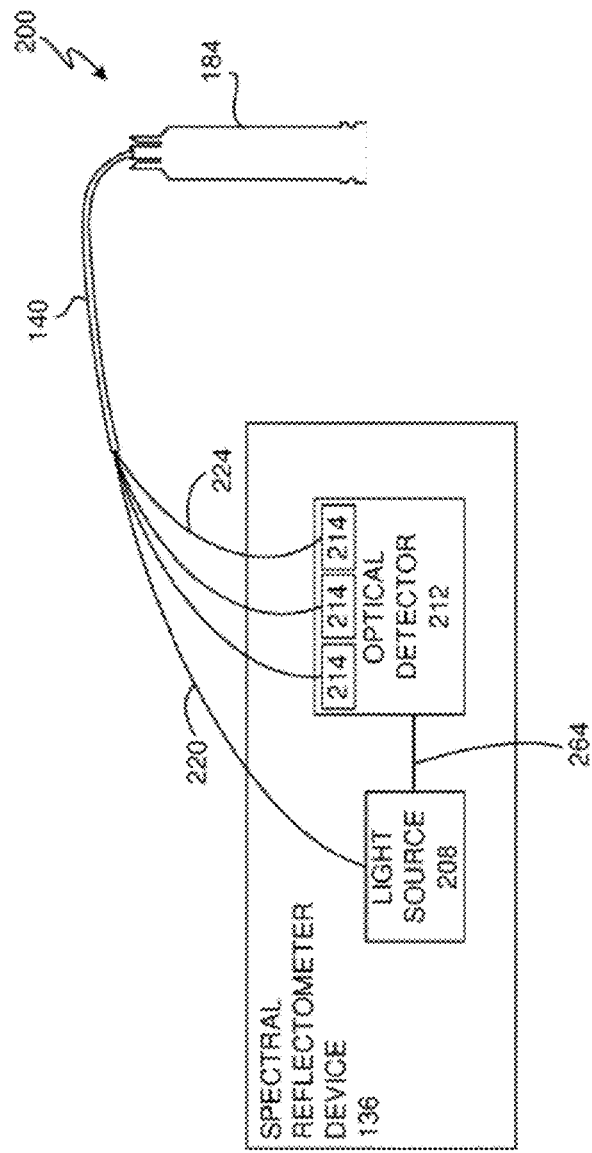
FIG. 3 is a schematic view of a spectral reflectometer system in accordance with certain disclosed embodiments.

FIG. 3 is a schematic view of an example spectral reflectometer system 200. The spectral reflectometer device 136 comprises a light source 208 and an optical detector 212. The optical detector 212 may comprise one or more photodetectors 214. The fiber optic cable 140 is connected to the spectral reflectometer device. In this example, the optical cable 140 comprises transmission optical fibers 220 and receiving optical fibers 224. In this example each receiving optical fiber 224 is connected to an individual photodetector 214. In other embodiments a plurality of receiving optical fibers 224 may be connected to the same photodetector 214. In this example, the optical detector 212 is a two-dimensional charge couple device (2-D CCD) array where an output from each receiving fiber 224 is detected by different regions of the 2-D CCD. For a spectral reflectometer system, the optical detector 212 provides output of intensity as a function of wavelength. This may be accomplished by using a prism or a filter that is able to separate out one or more wavelengths from the reflected light. Light may be directed from the light source 208 to the optical detector 212 through a fiber 264 to allow the monitoring of light source 208 variations over time to correct the signal and improve signal-to-noise ratio (SNR). The light from source 208 may produce a large beam spot (as described elsewhere herein) on a wafer.

Figure 4:
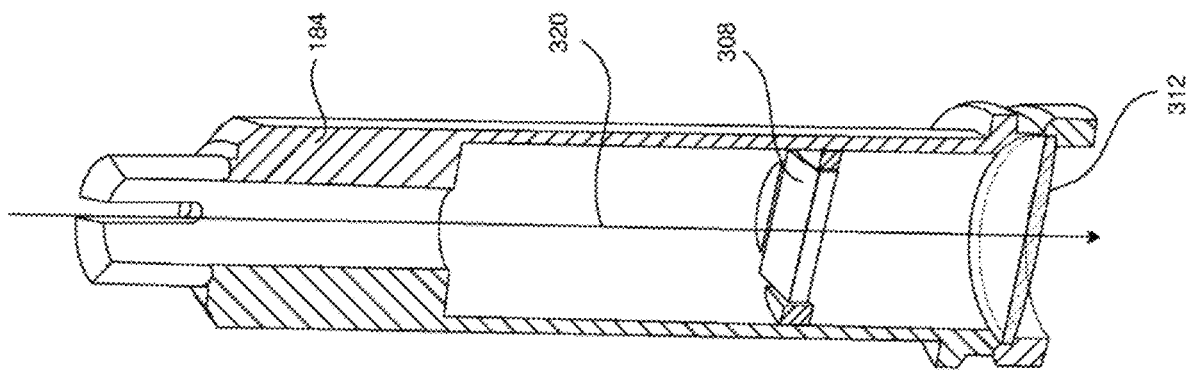
FIG. 4 is a cross-sectional view of a collimator housing of the spectral reflectometer system in accordance with certain disclosed embodiments.

FIG. 4 is a cross-sectional view of the collimator housing 184. Within the collimator housing 184 is a microlens array 308. A microlens array 308 comprises a plurality of adjacent lenses. As an example, a 10 mm×10 mm microlens array 308 may have at least 81 microlenses. The collimator housing 184 supports a collimator lens 312, which in this embodiment is a single lens that extends across a bore in the collimator housing 184. An optical path 320 extends along the length of the collimator housing 184 from an end of the optical cable 140, through the microlens array 308 and the collimator lens 312, so that the single collimator lens 312 extends completely across the optical path.

Multi-Station Processing Systems

Figure 5:
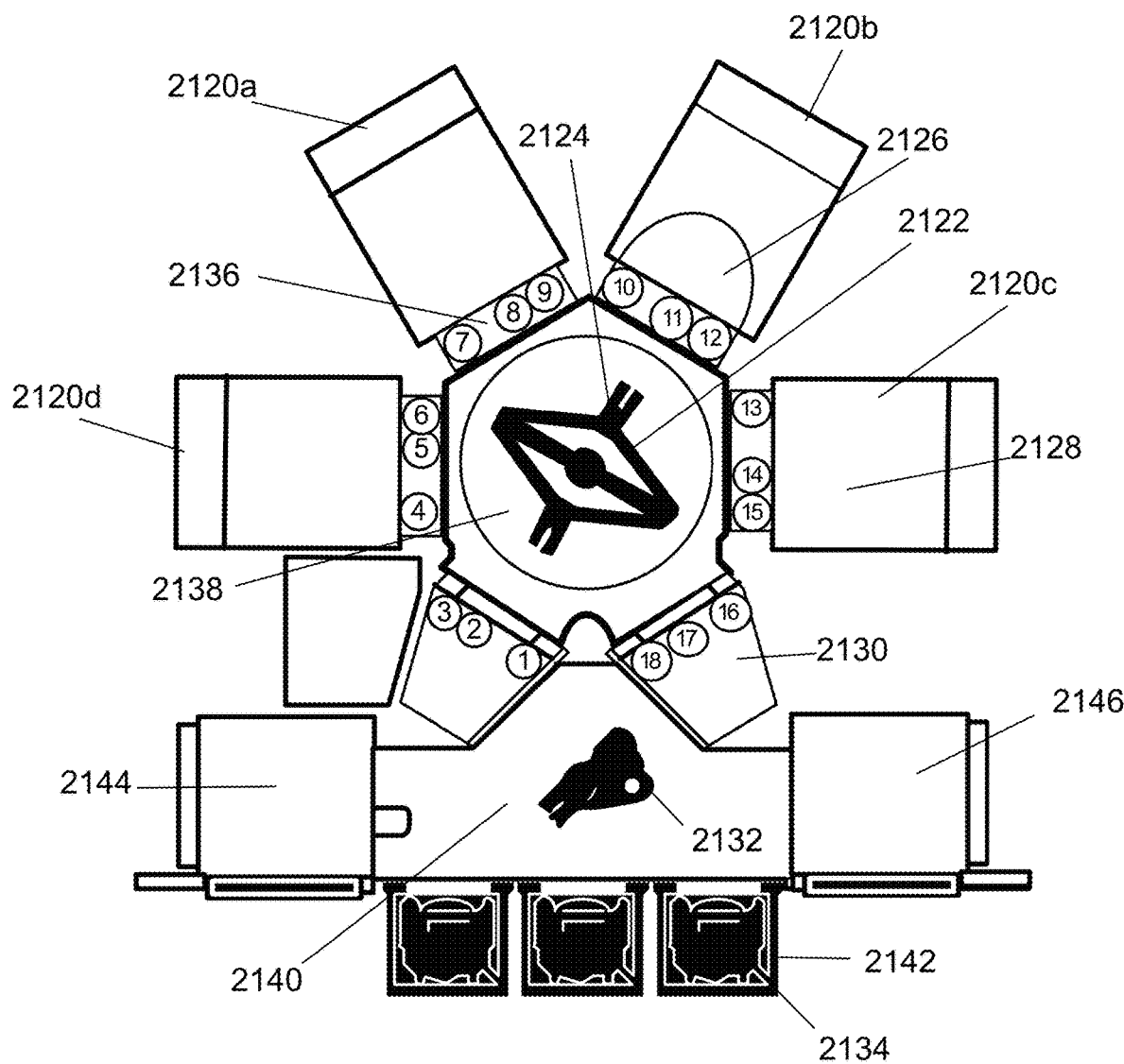
FIG. 5 is a schematic diagram of a multi-station processing system in accordance with certain disclosed embodiments.

FIG. 5 depicts an example semiconductor process cluster architecture with various modules that interface with a vacuum transfer module 2138 (VTM). The arrangement of transfer modules to "transfer" wafers among multiple storage facilities and processing modules may be referred to as a "cluster tool architecture" system. Airlock module 2130, also known as a loadlock or transfer module, is shown in VTM 2138 with four processing modules 2120a-2120d, which may be individual optimized to perform various fabrication processes. By way of example, processing modules 2120a-2120d may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 2120a-2120d) may be implemented as disclosed herein, i.e., for depositing conformal films, selectively depositing films by ALD, etching patterns, and other suitable functions in accordance with the disclosed embodiments. Airlock module 2130 and process modules 2120 may be referred to as "stations." Each station has a facet 2136 that interfaces the station to VTM 2138. Inside each facet, sensors 1-18 are used to detect the passing of wafer 2126 when moved between respective stations.

Robot 2122 transfers wafer 2126 between stations. In one embodiment, robot 2122 has one arm, and in another embodiment, robot 2122 has two arms, where each arm has an end effector 2124 to pick wafers such as wafer 2126 for transport. Front-end robot 2132, in atmospheric transfer module (ATM) 2140, is used to transfer wafers 2126 from cassette or Front Opening Unified Pod (FOUP) 2134 in Load Port Module (LPM) 2142 to airlock module 2130. Module center 2128 inside process module 2120 is one location for placing wafer 2126. Aligner 2144 in ATM 2140 is used to align wafers. In some embodiments, an optical metrology tool is integrated together with an aligning tool in aligner 2144. In some other embodiments, an optical metrology tool 2146 is provided and used for performing optical metrology (e.g., scatterometry, ellipsometry, and/or reflectometry).

In an exemplary processing method, a wafer is placed in one of the FOUPs 2134 in the LPM 2142. Front-end robot 2132 transfers the wafer from the FOUP 2134 to an aligner 2144, which allows the wafer 2126 to be properly centered (e.g., to rotate the wafer to a proper or known position) before it is etched or processed. After being aligned, the wafer 2126 is moved by the front-end robot 2132 into an airlock module 2130. Because airlock modules have the ability to match the environment between an ATM and a VTM, the wafer 2126 is able to move between the two pressure environments without being damaged. From the airlock module 2130, the wafer 2126 is moved by robot 2122 through VTM 2138 and into one of the process modules 2120a-2120d. In order to achieve this wafer movement, the robot 2122 uses end effectors 2124 on each of its arms. Once the wafer 2126 has been processed, it is moved by robot 2122 from the process modules 2120a-2120d to an airlock module 2130. From here, the wafer 2126 may be moved by the front-end robot 2132 to one of the FOUPs 2134 or to the aligner 2144.

It should be noted that the computer controlling the wafer movement can be local to the cluster architecture or can be located external to the cluster architecture in the manufacturing floor, or in a remote location and connected to the cluster architecture via a network.

Aligner with Integrated Optical Metrology

Figure 6B:
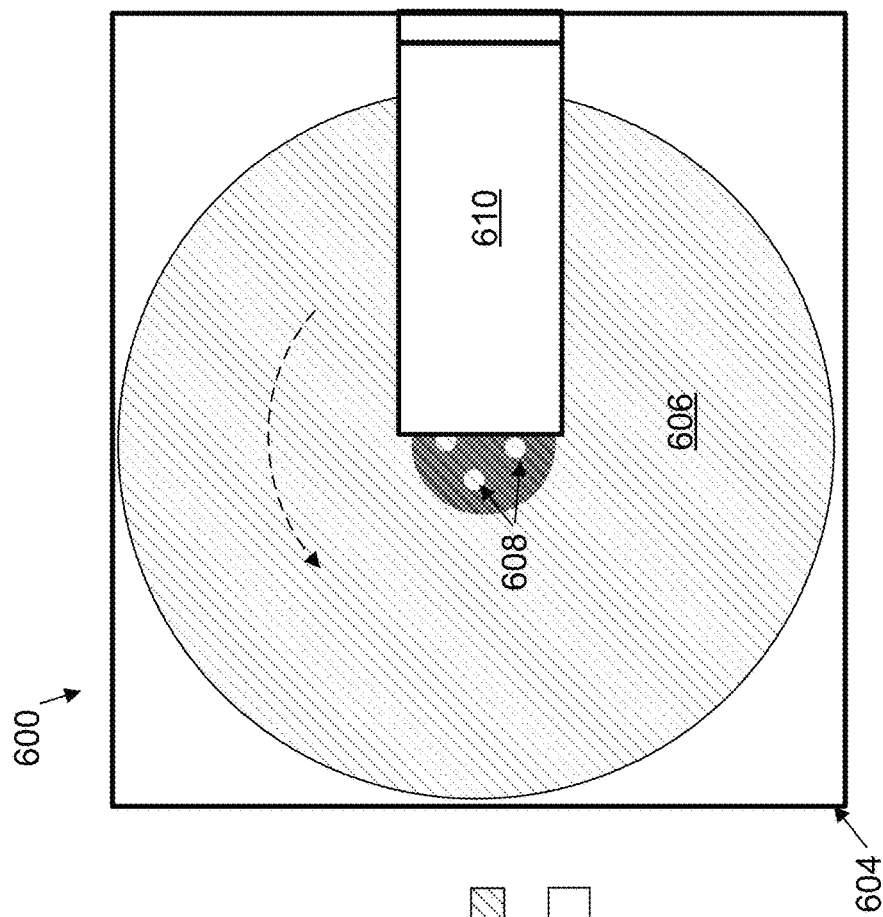
FIGS. 6A and 6B are side and top views, respectively, of an optical metrology tool integrated with a wafer aligner in accordance with certain disclosed embodiments.
Figure 6A:
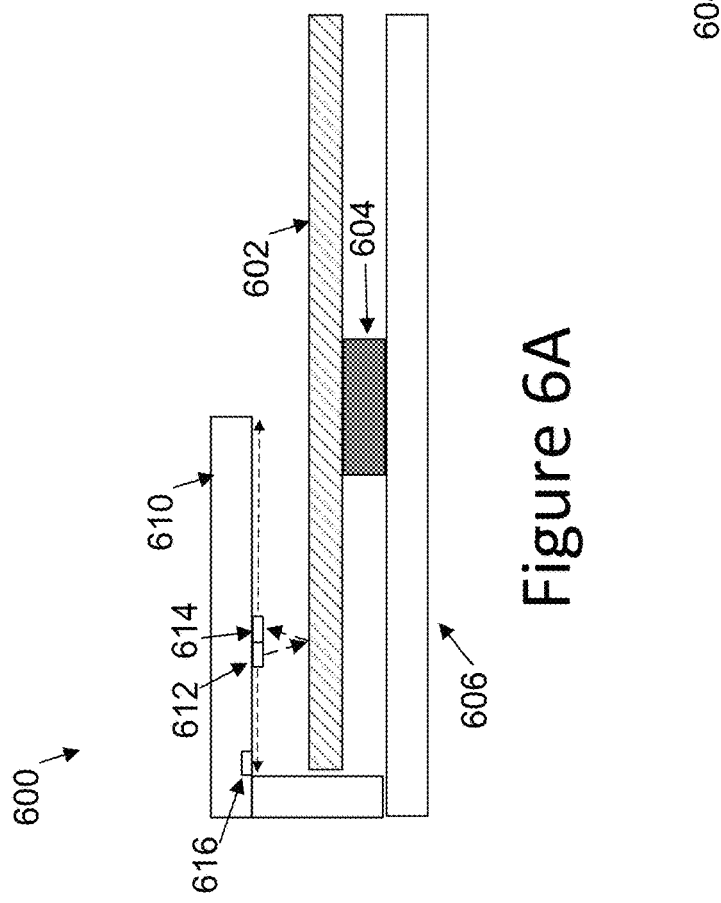

As previously noted, an aligner such as aligner 2144 may include an integrated optical metrology tool (which be an implementation of spectral reflectometer system 200). An example of an optical metrology and aligner tool 600 is shown in FIGS. 6A and 6B. The tool 600 is configured to support a substrate 602, with a substrate support structure 604 mounted to base 606. The substrate support structure 604, which may also be referred to as a chuck, may include one or more vacuum-based grippers 608, that secure the substrate 602 to the substrate support structure 604. The grippers 608 may be spaced apart on structure 604 to provide a stable and secure grip, using a vacuum, of the substrate 602. In some implementations, an aligner is integrated with a robot arm. The combination may be sufficient to collect optical metrology data for use with models described herein.

As indicated by the dashed arrow of FIG. 6B, the substrate 602 may be rotated while held in the optical metrology and aligner tool 600. In some embodiments, the substrate support structure 604 rotates in order to rotate the substrate 602 relative to sensors on arm 610. If desired, the substrate support structure 604 may be left rotating during optical metrology measurements or may be stopped during optical metrology measurements and then rotated between measurements. The tool 600, including substrate support structure 604, may be configured for, or reconfigurable between, operation at a constant angular velocity (e.g., a constant number of revolutions per second such as about 0.5 to 5 rotations per second, between 10 and 20 degrees of rotation per second, between 20 and 30 degrees of rotation per second, or greater than 20 degrees of rotation per second), at a constant linear velocity (e.g., at a number of revolutions that are adjusted as a function of radial scanning position such that the scanning head traverse the wafer at a constant velocity), at a zoned or partial constant angular velocity (where RPMs are adjusted in steps), or in another mode. As examples, the tool 600 may be configured for operation at rotation speeds between 0.2 and 0.5 substrate rotations per second (RPS), between 0.5 and 1.0 RPS, between 1.0 and 1.5 RPS, between 1.5 and 2.0 RPS, between 2.0 and 3.0 RPS, between 3.0 and 4.0 RPS, and/or between 4.0 and 5.0 RPS. The choice of operational mode may, in some cases, assist in the minimization and/or compensation for motion blur. As an example, a constant linear velocity operational mode may provide a consistent level of motion blur, which may be easier to compensate for than the variable motion blur that occurs in a constant angular velocity operational mode. In some other embodiments, the arm 610 is configured to rotate around the base 604 and thus around the substrate 602. In certain embodiments, the wafer is not rotated during scanning, rather the metrology head or beam spot are moved linearly in two dimensions to capture metrology data over the entire wafer surface. This approach may reduce variations in die and/or pattern orientation with respect to the beam orientation, and hence relative orientation of pattern information captured with metrology samples. This may allow more streamlined denoising of metrology signals.

The optical metrology and aligner tool 600 may include an arm 610 that extends over at least a portion (e.g., approximately half) of the substrate 602. One or more optical metrology emitters and sensors such as emitter 612 and detector 614 may be mounted on the arm. The emitter may be configured to produce a large beam spot (as described elsewhere herein) on a wafer. In some embodiments, the optical metrology emitters and sensors 612 and 614 are combined into a single element (e.g., an optical fiber that delivers light and also receives light off of the substrate 602). In some embodiments, one or more pairs of optical metrology emitters and sensors 612 and 614 are disposed on one or more movable components that translate along the length of arm 610 (e.g., in a radial direction relative to substrate 602). If desired, the emitters and/or detectors of the optical metrology tool may be remotely located (e.g., remote from arm 610) and may be coupled to one or more optical heads disposed on arm 610 via one or more optical fibers.

By translating the optical metrology emitters and sensors 612 and 614 radially and by rotating the substrate 602, the optical metrology emitters and sensors 612 and 614 can moved to any desired position relative to the substrate 602 (e.g., can obtain metrology measurements from some or all of the substrate 602).

Figure 7:
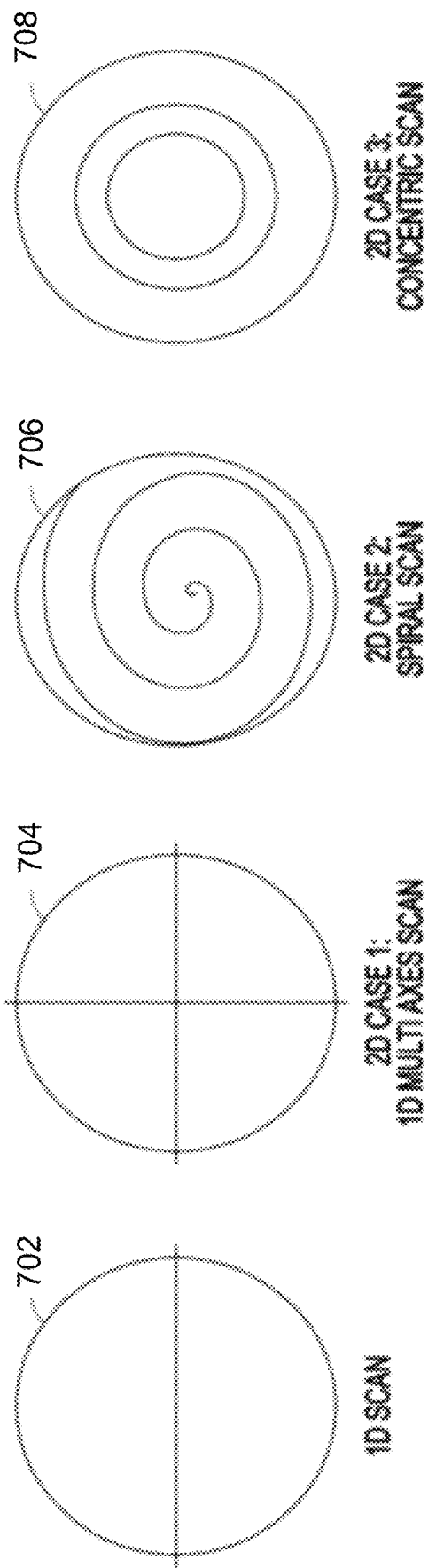
FIG. 7 illustrates various metrology scan patterns in accordance with certain disclosed embodiments.

FIG. 7 illustrates various examples of metrology scan patterns that may be employed by the optical metrology and aligner tool 600. Pattern 702 may provide optical metrology measurements along one or more scan lines. Pattern 704 may provide optical metrology measurements along two or more scan lines (e.g., perpendicular or merely non-parallel scan lines). Pattern 706 may provide optical metrology measurements along a spiraling scan line (achieved, in one example, by rotating the substrate 602 while translating the optical metrology emitters and sensors 612 and 614 along arm 610). Pattern 708 may provide optical metrology measurements along multiple concentric circles (achieved, in one example, by completing at least one complete rotation of the substrate 602, for each of multiple positions of the optical metrology emitters and sensors 612 and 614 along arm 610). These are merely illustrative scan patterns and, in general, any desired scan pattern may be used.

If desired, arm 610 may be implemented as an articulated robot arm. As an example, arm 610 may include one, two, three, or more than three segments coupled together with joints, with a first segment mounted to a foundation (movable or stationary) and a final segment holding an optical metrology head (e.g., including optical metrology emitters and sensors 612 and 614). With arrangements of these types, the optical metrology head can be scanned across the substrate 602 in any desired pattern.

In some embodiments, optical metrology and aligner tool 600 may perform system health checks and/or calibrations. In particular, the tool 600 may be configured to perform calibrations by obtaining measurements off one or more calibration standards (e.g., partial or whole substrates or wafers with known properties). As an example, a calibration standard can be placed below the nominal position of wafers loaded into tool 600, such that tool 600 can calibrate itself when no wafer is present in tool 600 (e.g., before wafer place into tool 600 or after wafer pick out of tool 600). Such an arrangement may be particularly beneficial in embodiments in which optical metrology emitter(s) 612 and/or and sensor(s) 614 are stationary (e.g., not on a linear stage). In arrangement in which the optical metrology emitter(s) 612 and/or and sensor(s) 614 are mounted to a moving component (e.g., a linear stage such as arm 610), one or more standards can be placed adjacent to the nominal position of wafers loaded into tool 600. In such arrangements, calibration measurements by tool 600 of the standard(s) may occur when the emitters 612 and/or sensors 614 are transitioning over to (or away from) a loaded wafer. Each calibration standard can include one or more coupons (e.g., sections of substrate smaller than a full wafer) with known properties. As examples, each calibration standard or coupon could be bare silicon (or other semiconductor), a wafer with a covering film, a wafer with one or more patterned layers of interest, etc.

If desired, a processing system including an optical metrology tool may include a reference wafer (e.g., standard, coupon) chamber configured to store additional calibration wafers (e.g., additional calibration standards and/or coupons). The different calibration wafers can be scanned by a metrology tool such as tool 600 on an intermittent basis. The different calibration wafers may contain dies with varying structures of interest. As an example, if a parameter of interest is critical dimension (CD), the different calibration wafers may include a first die having a CD of X nm, a second die having a CD of X+1 mm, a third die having a CD of X+2 mm, a fourth die having a CD of X+3 mm, etc. (e.g., the wafers may include wafers covering whatever range of CDs is desired). The reference chamber may include slots to store multiple wafers. If desired, the reference chamber can also be used for storage of production wafers (e.g., non-reference wafers). As an example, it may be desirable to store, in a reference chamber or elsewhere, a wafer needing a relatively high number of measurements from tool 600, while other wafers are being processed (e.g., by tool 600 or another tool in the system). As examples, a reference wafer chamber could be positioned in any suitable location within a system, such as the position of optical metrology tool 2146 or one of the positions of process modules 2120a-2120c.

In at least some arrangements, optical metrology tools such as tool 600 may implement mitigation strategies for off-gassing wafers. In some situations, off-gassing wafers can degrade the optics in emitters 612 and/or sensors 614. Thus, tool 600 may include one or more windows between the optical components and wafers loaded into the tool. The windows may be formed of suitable materials such as quartz, glass, etc. and may protect the optical components from off-gassing. Tools such as tool 600 may alternatively, or additionally, protect from off-gassing contamination by gas flow (e.g., by flowing a safe gas such as Nitrogen in such a manner as to prevent off-gases from contaminating the optical components).

In addition to optical metrology emitters and sensors 612 and 614, tool 600 may include additional sensors such as chamber temperature sensors (e.g., infrared sensors and/or cameras), wafer temperature sensors (e.g., infrared sensors and/or cameras), pressure sensors, humidity sensors, vibration sensors (e.g., accelerometers). The additional sensors may be used for measuring the measurement chamber (e.g., the chamber of tool 600) and/or a reference chamber (e.g., a chamber holding reference wafers and/or wafers in metrology processing).

Optical Metrology Operating Parameters

In some embodiments, the reflectometer systems disclosed herein (such as in situ reflectometry system 200 and/or optical metrology and aligner tool 600) may be large beam spot reflectometers. As examples, a large spot reflectometer system may be configured to produce a spot (e.g., an illumination/detection area on a wafer) with a diameter of about 0.5 mm to 30 mm, about 1 mm to 15 mm, about 5 mm to 15 mm, about 8 mm and 12 mm, at least about 5 mm, or at least about 10 mm, as examples.

In some embodiments, the reflectometer systems disclosed herein (such as system 200 and optical metrology and aligner tool 600) may provide flashes of incident light at a frequency of about 1 Hz to 200 Hz, about 10 Hz to 80 Hz, about 15 Hz to 60 Hz, or at least about 100 Hz, as examples. The flashes may have a duration of about 0.5 to 10 microseconds, about 1 to 10 microseconds, about 1 to 6 microseconds, as examples. The angular resolution of the reflectometer system, per flash, may be about 1 to 20 degrees, about 5 to 10 degrees, or about 10 to 15 degrees, as examples.

While the wafer is being rotated by a substrate support structure, the motion of the wafer may induce motion blur. At the edge of the wafer where motion blue is the highest, the motion blur may be, as examples, about 0.1 to 3 micrometers, about 0.5 to 2 micrometers, about 1 to 2 micrometers, or at least about 3 micrometers (e.g., the wafer may travel less than such distances in the timespan of a single flash).

The reflectometer systems disclosed herein may utilized polarized light or unpolarized light. When using polarized light, the reflectometer may track and/or rotate the polarization in order to improve the obtained data. The reflectometer systems disclosed herein may have a throughput of at least about 5 scan locations per second, or about 1 to 100 scan locations per second, about 2 to 50 scan locations per second. As one particular example, a reflectometer system disclosed herein may be able to scan approximately 540 wafer locations in approximately 27 seconds (e.g., may have a scan rate of 20 locations per second). In some embodiments, the reflectometer and/or optical metrology tools (such as tool 600) disclosed herein is able to scan a 300 mm diameter wafer, collecting a desired minimum number of scans, in less than about 1 minute, about 1 to 2 minutes, less than about 2 minutes, or about 2 to 3 minutes, as examples. In some arrangements, the reflectometer and/or optical metrology tools (such as tool 600) disclosed herein is configured to capture, while scanning a particular wafer's surface, about 1 to 10,000 scans (e.g., metrology samples) or about 100 to 1,000 scans, as examples. The scan rate may be limited by a data acquisition rate of the metrology tool sensor. For example, the maximum rate may be about 100 or about 200 ms per measurement. When a sensor is multiplexed with, e.g., multiple fiber bundles, the scan rate scales proportionately.

In some embodiments, an optical metrology system of the type disclosed herein, such as system 200 of FIG. 3 and/or tool 600 of FIGS. 6A and B, may implement multiplexing (e.g., may collect optical signals simultaneously and/or with multiple optical heads). As an example, a reflectometer or other optical metrology system may have multiple optical paths, with each path being associated with a different region or spot on the wafer and also with a different region of one or more optical detectors. As discussed in connection with FIG. 3, a reflectometer or other optical metrology system may have multiple receiving optical fibers 224, each of which is connected to an individual photodetector and/or detected by a different region of one or more optical detectors (e.g., one or more charge couple devices). Each optical fiber 224 may be focused on a different region of a wafer (an individual spot), where the individual spots of the different optical fibers are only partially overlapping or are entirely non-overlapping. In such embodiments, the optical metrology system as a whole has a spot size formed from the combination of individual spots. Multiplexing may help to increase the throughput of an optical metrology system. In some embodiments, the multiple optical fibers can be positioned on a translating mount (e.g., translating along arm 610 as shown in FIGS. 6A and B). In some other embodiments, different optical fibers can be fixedly positioned at different radial positions (e.g., a first optical fiber may be near an edge of a wafer, a second optical fiber may be near an center of a wafer, additional optical fibers may be dispersed between the first and second optical fibers), such that the metrology tool can scan a wafer without requiring translation of an optical head.

An optical metrology system implementing multiplexing may have one or more light sources, such as light source 208 of FIG. 2. In embodiments having one light source and multiple detectors (e.g., multiple optical fibers), it may be desirable to pulse the light source and detect reflected light from only a subset (e.g., one) of the detectors. In such configurations, the optical metrology system may implement multiplexing in time. In other embodiments, the optical metrology system may include multiple light sources and multiple light detectors (up to and optionally exceeding one light source per light detector). Each light source may be associated with a single light detector or multiple light detectors. Embodiments with multiple light sources may provide higher throughput as it facilitates detecting light from multiple light detectors in a simultaneous and/or rapid fashion.

The optical metrology and aligner tool 600 may also include an alignment sensor 616, which is configured to detect a notch, marking, or other structure on substrate 602 and/or detect an eccentricity, shape, size or other property of substrate 602 and thereby determine an orientation of the substrate 602. The orientation of the substrate 602 may be needed for subsequent processing by metrology modules, fabrication modules, or other tools (e.g., process modules 2120a-2120c of FIG. 5). In some embodiments, the orientation of the substrate 602 is utilized in performing optical metrology with optical metrology emitters and sensors 612 and 614.

In some embodiments, a processing system including an optical metrology tool may include one or more automatic wafer centering (AWC) technologies. AWC technologies may be configured to center a wafer (i.e., substrate) before the wafer is loaded into a tool such as optical metrology and aligner tool 600, which may help to reduce or eliminate the impact of any wafer eccentricity on measurements obtained by tool 600.

Control Module

Figure 8:
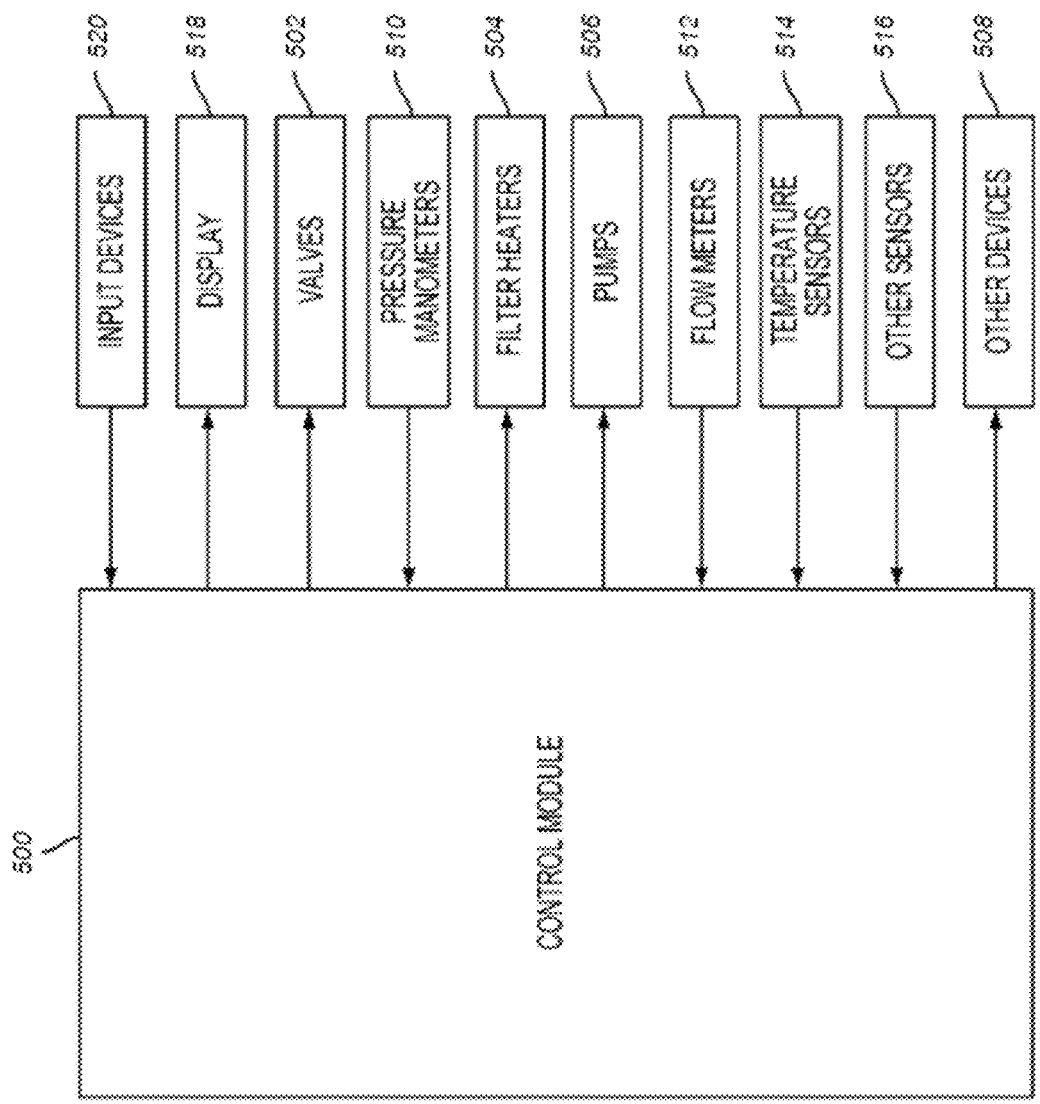
FIG. 8 is a schematic diagram of an example control module for controlling fabrication and metrology tools in accordance with certain disclosed embodiments.

FIG. 8 shows an example control module 500 for controlling the systems described above. In one embodiment, the controller 124 of FIG. 2 may include some of the example components. For instance, the control module 500 may include a processor, memory and one or more interfaces. The control module 500 may be employed to control devices in the system based in part on sensed values. For example only, the control module 500 may control one or more of valves 502, filter heaters 504, pumps 506, and other devices 508 based on the sensed values and other control parameters. The control module 500 receives the sensed values from, for example only, pressure manometers 510, flow meters 512, temperature sensors 514, and/or other sensors 516. The control module 500 may also be employed to control process conditions during precursor delivery and deposition of the film and/or during etching processes. The control module 500 will typically include one or more memory devices and one or more processors.

The control module 500 may control activities of the precursor delivery system and deposition and/or etch apparatus. The control module 500 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 500 may also monitor the pressure differential and automatically switch vapor precursor delivery from one or more paths to one or more other paths. Other computer programs stored on memory devices associated with the control module 500 may be employed in some embodiments.

Typically there will be a user interface associated with the control module 500. The user interface may include a display 518 (e.g., a display screen and/or graphical software displays of the apparatus and/or process conditions), and user input devices 520 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 510, and thermocouples located in delivery system, the pedestal or chuck (e.g. the temperature sensors 514). Appropriately programmed feedback and control algorithms may be used with data from these sensors to maintain desired process conditions. The foregoing describes implementation of embodiments of the disclosure in a single or multi-chamber semiconductor processing tool.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Denoising Large Beam Spot—Computational Components

One or more computational models are employed to receive, as an input, optical signals obtained from large beam spot optical metrology on a preprocessed wafer, and generate, as an output, a two-dimensional distribution of temperature values, and optionally other process parameter settings for processing the wafer. The subject computational models may be implemented as logic that executes on computer hardware such as that described elsewhere herein, e.g., in connection with the discussion of FIG. 8, control systems, etc.

In certain embodiments, a denoising machine learning model is used to process large spot size optical metrology signals in a way that removes or decreases noise. The output of the denoising machine learning model contains spatial (over the surface of the wafer) information about one or more wafer structure variables such as critical dimension and one or more properties of a layer to be processed. In certain embodiments, the denoising machine learning model receives raw or minimally processed optical metrology signals from a large beam spot and reduces the noise content in that signal, such as noise content originating from pattern mixing due to the large beam spot encompassing multiple patterns and/or multiple dies, possibly at various orientations with respect to a reference orientation.

In certain embodiments, a second machine learning model is used to convert the output of the denoising machine learning model to settings for operating a process chamber to process the preprocessed wafer. In certain embodiments, the process chamber settings include settings for a position selective activation component (e.g., a chuck with a two-dimensional array of heaters) and/or one or more other process settings for processing the wafer. The process settings may produce improved wafer-to-wafer uniformity and/or improved within wafer uniformity. More generally, the process settings cause the wafer process to produce a wafer having specified target properties.

A Metrology Data Denoising Machine Learning Model

This model may render data obtained from large beam spot optical metrology on preprocessed semiconductor wafers useful for further analysis.

During operation, the denoising machine learning model removes some noise such as pattern mixing from the raw optical metrology signal obtained from a preprocessed wafer and thereby renders the optical metrology signal suitable as an input for another application such as a computational tool (e.g., a second MLM) that can predict some aspect of wafer processing or post-processing wafer properties These predictions may include the spatial distribution of wafer structure variables, such as critical dimension or layer thickness, over the surface of the preprocessed semiconductor wafer.

The denoising machine learning model (the denoising model) may address challenges arising because the system employs a large beam. Large beams are beneficial because they allow a relatively fast and complete assessment of conditions on a preprocessed wafer. When scanned over a wafer surface, a large beam spot allows rapid capture of signal over the entire wafer surface. Unlike standalone metrology systems, a scanning, large beam spot metrology tool can collect its relevant signal, without stopping at individual metrology sites within micron-level accuracy and waiting for data acquisition before moving onto the next site. By comparison, standalone systems use a much smaller spot size and can either have the problem of sampling relatively small fraction of the wafer surface or, if they sample a large fraction of the wafer surface, they take a long time and thereby decrease throughput.

To further elaborate, a large beam optical metrology system employs a large beam spot to capture information over a wide area of the wafer surface at any instant in time. Typically, the beam is relatively large vis-à-vis the size of different regions or patterns of dies that are being processed. For example, a large beam may be about 10 mm in diameter. By comparison, a small modern die may have dimensions on the order of 8 mm×5 mm. Regardless of the size of the beam in comparison to die sizes, it can be expected that some fraction of the signal captured during a scan will contain signal introduced because the beam spot illuminates concurrently, at any instant in time, multiple patterns or portions of multiple patterns, which introduce noise in the wafer structure parameter signal content. These patterns are present in design layouts that are implemented lithographically during fabrication of a semiconductor device. As an example, patterns of a design layout may be produced by arrays of memory cells. A typical DRAM cell area occupies about 70-80% of the total die area, with peripheral circuitry contributing the remaining area.

Because the beam size is relatively large by comparison to the size of patterns it illuminates, and more particularly because the region occupied by a large beam spot often includes multiple different patterns, the information content in an optical signal obtained using large beam spots includes "noise" from mixed patterns of periodic structures on the one or more die surfaces that are concurrently collected (not imaged as there is no image in spectra) using the optical metrology tool with a large beam spot.

For some applications, what is really desired from the information content in the signal obtained from the large beam is information about wafer structure parameters of the integrated circuit such as the critical dimension of features on a die, the thickness of a layer being deposited or etched on a die, and the physical properties of the layer that is being deposited or etched. Examples of optical dispersion of a layer are its refractive index, n, and, and its extinction coefficient, k. In various embodiments, the wafer structure parameters are nanometer-scale features on the wafer surface. Their values on or within a wafer may be evaluated or predicted for a postprocessed wafer, i.e., a wafer that has been processed by an etch or other process modeled algorithmically as described herein.

To this end, the denoising machine learning model may be configured to decouple incoming signal arising from the wafer structure parameters (or variations thereof) from incoming signal arising from pattern mixing and other sources of signal that can interfere with the signal created by the wafer structure parameters. Examples of other sources of interfering signal may include instrument error, such as that related to positioning and indexing, as well as alignment and/or calibration of the optical system. Thus, in various embodiments, a role of the denoising machine learning model is to process the signal obtained from the large beam spot metrology to at least partially remove the contribution from pattern mixing or other optical contributions that are not relevant to process parameters of interest such as critical dimension, layer thickness, and layer physical properties.

Certain instrument-specific sources of interfering signal can be mitigated by controlling the instrument. For example, the optical metrology tool may be configured to vary the polarization of an incident beam as a function of where on a wafer surface the beam is currently directed. This can account for variations during a scan caused by changes in the orientation of the pattern in a design layout with respect to beam position and/or polarization state.

Various algorithmic techniques may be employed to remove or reduce the contribution of this pattern mixing content or other noise to the optical metrology signal. One of these is a variational autoencoder in which the pattern mixing is treated as noise and removed from e.g., a latent space in the autoencoder.

Inputs to the Denoising Machine Learning Model:

Inputs are provided to a trained machine learning model. The model may execute on these inputs on a wafer-by-wafer basis during production. In certain embodiments, the inputs are obtained from pre-processed wafers; i.e., wafers that are not yet processed by the process or process chamber that is to have its settings controlled.

In certain embodiments, the input to the denoising machine learning model is raw or minimally processed optical metrology data. For a given wafer, the input data may comprise many broadband spectra, one for each position of a large beam spot on the wafer surface. In such cases, each spectrum has an associated two-dimensional position on the wafer surface. That two-dimensional position may be represented in polar coordinates is R and $\ominus$ or X and Y. The actual values of R and $\ominus$ are optionally chosen to be the center of the beam or some other location within the large beam spot. As examples, the "center" of the beam may be the geometric center (centroid) and/or the position of maximum light intensity in the beam spot area. In certain embodiments, having a circularly uniform beam profile and/or unpolarized light provides one or more advantages such as removing unnecessary degree(s) of freedom.

In some cases, the beam spot positions (and associated metrology signal) are densely packed on the wafer surface. In some cases, adjacent beam spots overlap. In some cases, the beam spot positions of nearest neighbor spots are separated by about 5 millimeters or less. In some cases, the beam spot positions of nearest neighbor spots are separated by about 1 millimeter or less.

The spectrum from any position on the wafer may be represented as optical intensity data at any number of wavelengths. For example, the spectra may comprise at least about 50 wavelengths or at least about 100 wavelengths.

In certain embodiments, the input data may also specify the beam position with respect to one or more dies or patterns in a design layout. Thus, in some embodiments, the input data may specify a clearly defined two-dimensional position on the wafer surface, relative to one or more die or patterns on the wafer surface, as determined using a design layout for the dies, for example, and the spectrum or other optical signals obtained by the optical metrology tool at a particular location. The beam position on the wafer plane may be calculated from a theta encoder position (relative to the wafer notch or other registration point), an R encoder position. In subsequent processing, this position can be translated to a position relative to die corner or other layout reference point.

In certain embodiments, the input data optionally includes information about the orientation of one or more die or patterns with respect to the orientation of the beam spot. In various embodiments, the orientation of the pattern or die varies as a function of the azimuthal position on the wafer for a given reference position of the wafer. That reference position may be defined by, for example, a wafer notch or other registration position on the wafer being at a particular position. In certain embodiments, pattern orientation information is used when the beam is not circularly uniform. For example, if two possible beams have the same beam coverage and orientation, but if one beam's spot is not circularly uniform on the wafer plane, then this additional degree of freedom (of optical beam orientation) impacts the interaction of the beam with pattern and may introduce other variables that potentially create unaccounted instrument error. Accounting for the pattern orientation can allow the error to be addressed.

In certain embodiments, inputs to the model may include the following.

Spectra collected from various locations on an incoming wafer's surface. The spectra may be captured over a wide wavelength range ("broadband") that, for example, spans the visible spectrum and optionally extends into the UV and/or IR domain. In certain embodiments, the broadband metrology signal spans a spectral range including wavelengths of approximately 190-2000 nm. The spectra are indexed with wafer location information. In polar coordinates, these indexes specify values of R and $\ominus$ (azimuth angle relative to a wafer's alignment notch). In some implementations, the metrology tool is operated in a manner that captures spectra with the consistent patterns of the die layout. As an example, this may be achieved by parking the beam at radial (R) positions quantized by the die or pattern size. It may be advantageous to compare signals captured at these locations because the rings (azimuthally varying positions having a common R value) may remove the pattern contribution. In some implementations, beam scanning trajectories leverage this coupling by aligning the X or Y orientation of the wafer (relative to notch) with the direction of linear scan, so that a radial line scan of R will go along an orthogonal cut of the design layout pattern, enabling computational removal of pattern contributions.

In addition to location and wavelength information, the metrology tool may provide information about the polarization state of the incident beam. The spectra may be generated using unpolarized or polarized incident radiation. In certain embodiments, the polarization state is continuously tracked or varied as a function of location. For example, in some cases, the polarization is accounted for by indexing the source light polarization to the azimuth angle of the wafer so that signal variation due to the orientation of the wafer is removed.

The information embedded in the spectral signals originates from various sources, including:

Polarization (not if using unpolarized light)

Pattern mixing (illumination area relative to the die as well as orientation of the pattern relative to an indexed direction of the optical beam, when the optical beam profile is not symmetric). This can be understood for the case where the beam is circularly symmetric and unpolarized, then no matter how the pattern under the beam rotates around the beam center, the metrology signal will have identical spectra, which is the integration of all of the reflectance per unit area over the entire beam size. If the beam is not symmetric, this above integration will need to go from dr (integration over r) into dr*d_theta. An index for the theta is needed.

The wafer structure parameter values for an incoming (pre-processed wafer); these include, for example, CD, layer thickness, and layer properties (e.g., n and k), all as a function of location on the wafer surface. The ability of the model to preserve signal containing information about variations in these parameters may be captured during training process using metrology systems.

Instrument error related to positioning and indexing. In some cases, this can be sufficiently removed by calibration. This may avoid the need for the machine learning model to isolate or eliminate its contribution.

Outputs from the Denoising Machine Learning Model:

In certain embodiments, the output of the denoising machine learning model is a denoised version of the input optical metrology signals. In such embodiments, the output may present information substantially in the form of the raw metrology input signal. In other words, the data may include multiple spectra captured at multiple positions on a wafer surface. In some cases, the output takes the form of a spatial map of the wafer surface with spectra at each of many beam spot positions in two-dimensional space on the wafer surface.

In certain embodiments, the output of the denoising machine learning model is a latent space representation of the optical metrology input signals. The latent space may be provided by a transformation of the data space of the raw metrology data (e.g., intensity as a function of wavelength) to an abstract representation of the data that does not directly map to physical dimensions such as wavelength, intensity, polarization, etc. In certain embodiments, the latent space is determined using a machine learning model such as a neural network or an autoencoder. In certain embodiments, the latent space is determined using principal component analysis.

In certain embodiments, the output optionally includes information about the beam's frame of reference with respect to dies, patterns, or other features of the design layout. The information may include (a) the beam position with respect to patterns or die in the design layout, and/or (b) orientation of the beam with respect to one or more patterns or dies that it encompasses.

Spatial models of incoming (pre-processed) wafers. Each spatial model represents a single pre-processed wafer. Each spatial model provides a representation of the metrology data that preserves information about one or more wafer structure parameter values such as values of CD, layer thickness, and layer properties, as well as variations of these parameter values as a function of position (e.g., R and Θ) on the pre-processed wafer surface. The spatial models provide relatively clean representations of the metrology signal, with some or all of the interference from pattern mixing and/or other noise sources removed from the input large beam size optical metrology signal.

In certain embodiments, multiple abstract representations of the large beam spot metrology data are each given its own spatial model. In some embodiments, the metrology data is projected onto an abstract multi-dimensional space such as a latent space produced using principal component analysis or a variational autoencoder. Thus, for example, for a given pre-processed wafer, the model will provide one spatial model for one dimension of a latent space, another spatial model for another dimension of the latent space, and another spatial model for a third dimension of the latent space. Thus, in certain embodiments, the output of the denoising machine learning model is a latent space representation of the spectra in an autoencoder. For example, the latent space may have 20 dimensions. For each spectrum with its associated positional index (R and theta), there is a 20-dimensional vector that can represent this wafer. Each of the 20 dimensions may then be decomposed into Zernike polynomials using its R and theta positional indexes. It should be understood that because the latent space is a reduced dimensional space with respect to the raw data space, the raw data may have more than 20 dimensions in this example. In some embodiments, each wavelength is treated as a separate dimension of the raw data. In certain embodiments, the raw data has at least about 100 dimensions or even at least about 1000 dimensions. An autoencoder or other computational tool can capture the covariance of these raw dimensions and to reduce them to latent dimensions.

The spatial models may represent these position-dependent parameter values in various formats. In certain embodiments, a spatial model is provided as a Zernike decomposition. In various embodiments, a separate routine is employed to convert the direct output of the model to spatial models.

General Approaches to Training a Denoising Optical Metrology Model

Training Data

Training the denoising machine learning model may employ various types of training data. In certain embodiments, the training uses information about at least one training wafer. One or more training wafers may have a uniform or nearly uniform spatial distribution of process dependent parameters (e.g., thickness and/or CD). One or more training wafers may have a nonuniform spatial distribution of the process dependent parameters. In some embodiments, a series of preprocessed training wafers is used, with each training wafer having a different spatial distribution of wafer structure parameter values. For example, one training wafer may have CD values vary at one, two, or more locations on the wafer surface. Another training wafer may have azimuthally varying values of n and k. In certain embodiments, the distribution of values of the wafer structure parameter values on training wafers is chosen using a design of experiment methodology.

The training data may be comprised of optical metrology data from a metrology tool that is very similar to that used for process control during fabrication of production wafers. In addition, or alternatively, the training data may comprise optical signals obtained from standalone or small spot size metrology. In certain embodiments, the small spot size metrology data provides greater resolution or sensitivity than that of the large beam spot optical metrology. As a consequence, the small spot size metrology data may provide additional information about variation of wafer structure parameter values. In certain embodiments, the small spot size metrology data can be used as ground truth or a tag for supervised learning of the denoising machine learning model.

In certain embodiments, the training data includes information about the design layout of dies and/or patterns within dies on a wafer surface. Such layout is defined for the lithography, deposition, and/or etch processes employed to fabricate the integrated circuit. The layout for a layer being examined by the optical metrology may provide information about the locations of the boundaries and orientations of the individual die on the wafer surface. The layout may provide other information such as the location, orientation, and/or characteristics of particular patterns within the dies. The information provided by the design layout may facilitate the training by correctly account for the pattern and die information contained in large beam metrology signals.

To summarize, training data may include large beam spot metrology data from uniform preprocessed wafers, large beam spot metrology data from non-uniform preprocessed wafer (e.g., DOE generated wafers), small spot (standalone) metrology data, and design layout information. Additional training data that may optionally be employed includes beam intensity profile characteristics. In some cases, the training data may include beam intensity profile characteristics or other beam characteristics as a function of wavelength. Determining beam characteristics may be accomplished at the center of the wafer by rotating a single pattern around the beam center and decomposing the resulting metrology signal's Fourier components as a function of angular position. This may be a form of instrument calibration and it may make use of multiple wafers.

Figure 9:
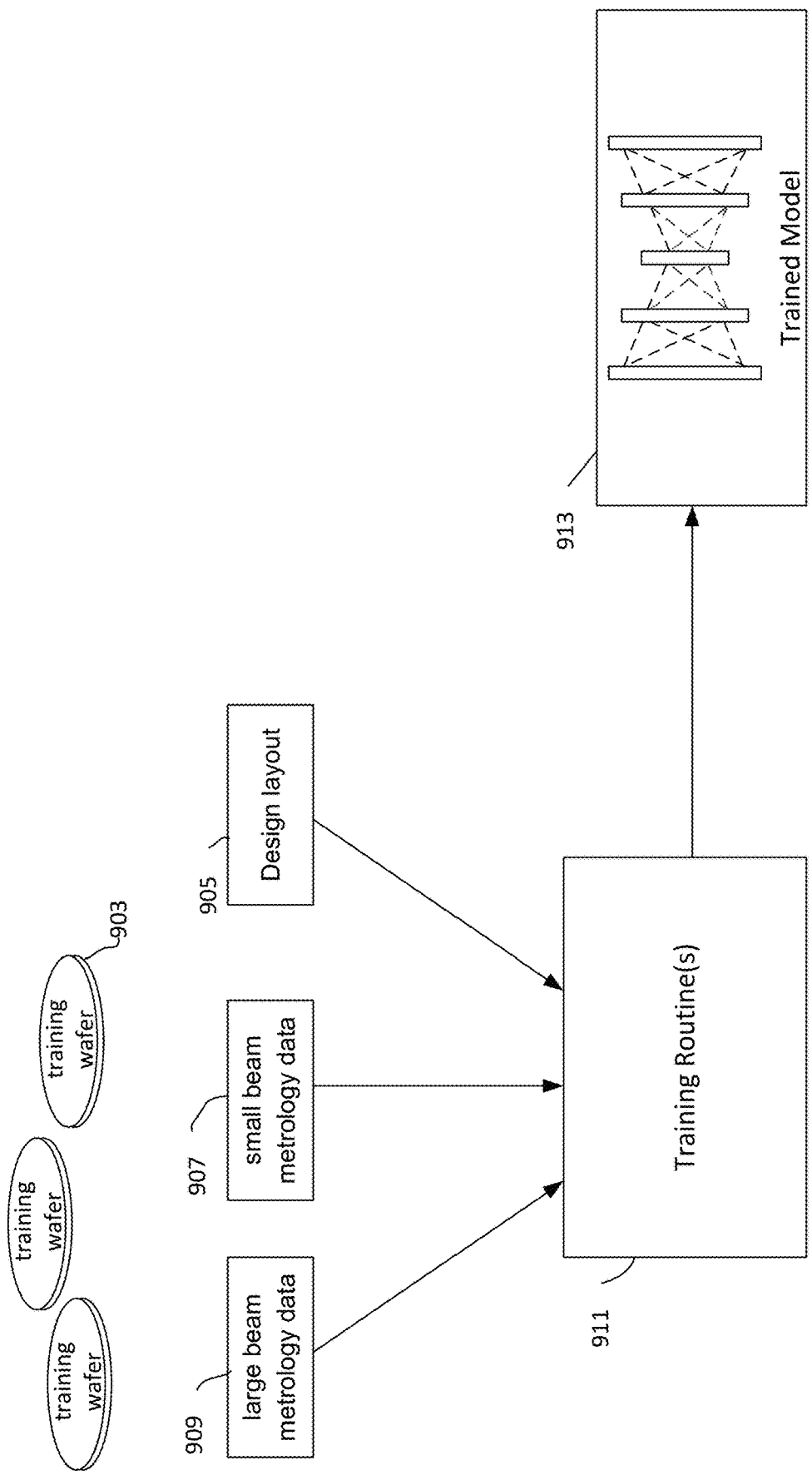
FIG. 9 illustrates a training method in which data and information is collected from and/or about one or more test or training wafers for training a denoising machine learning model.

FIG. 9 illustrates a training method in which data and information is collected from and/or about one or more test or training wafers 903. This data and information serve as one or more training sets for training a machine learning model. In the depicted embodiment, information about training wafers includes a full or partial design layout 905 of the dies or patterns formed on one or more of the training wafers. Data from the training wafers includes small beam spot size metrology data 907 and large beam metrology data 909.

The training wafer information and data from all these, and optionally other, sources are provided as training data to machine learning training routine(s) 911, which uses these inputs to train a machine learning model 913 in a supervised and/or unsupervised fashion.

In some implementations, the training routine(s) 911 act on the training sets sequentially. For example, the training routines may first act on the design layout information 905 and/or the large beam spot metrology data 907 alone or in combination, and only later do the training routines act on the small beam spot metrology data 909. Such sequential training may take advantage of transfer learning. In some embodiments, the training routine 911 acts on all three sources of training data concurrently.

Preliminary Models

In certain embodiments, the denoising machine learning model is trained in one or more iterations, and in fact may employ multiple separate machine learning models, some serving as a basis for transfer learning of later developed refinements or versions of the denoising machine learning model. In various embodiments, transfer learning is a training process that starts with a previously trained model and adopts that model's architecture and current parameter values (e.g., previously trained weights and biases) but then changes the model's parameter values to reflect a new or different training data. In various embodiments, the original model's architecture, including convolutional windows, if any, and optionally its hyperparameters, remain fixed through the process of further training via transfer learning.

In some embodiments, a preliminary model is used to identify a collection latent dimensions or other representations of the beam spot signal to use in an output of a fully trained machine learning model used for process control with process wafers.

Figure 10:
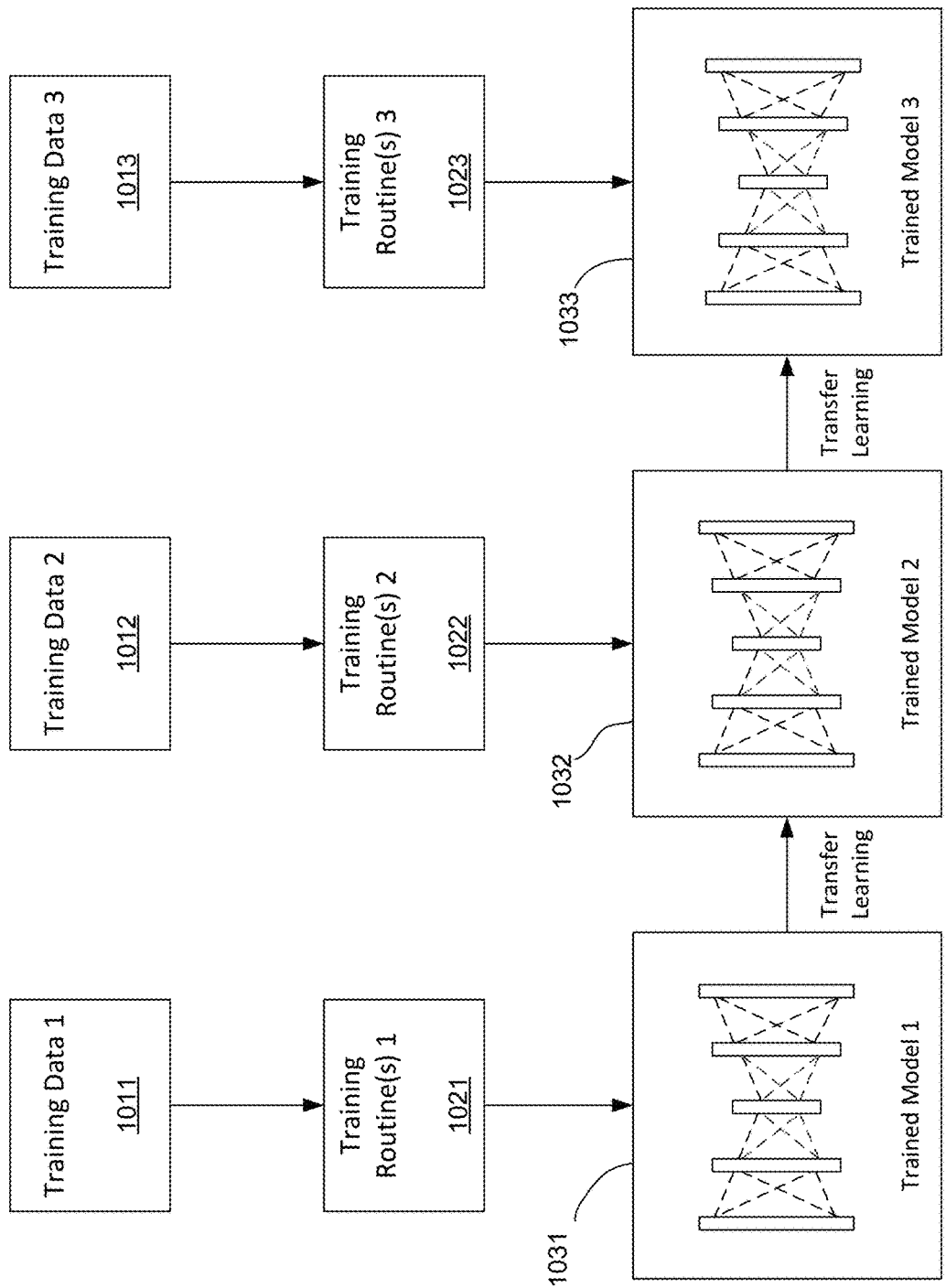
FIG. 10 illustrates a transfer learning procedure in which training data from multiple sources is employed sequentially to train a denoising machine learning model.

FIG. 10 illustrates an example transfer learning procedure 1001 in which training data from three or more sources is employed sequentially to train a final machine learning model. In the depicted embodiment, each of three different sources of training data, data 1011, data 1012, and data 1013, is processed by its own separate training routine(s), routine(s) 1021, routine(s) 1022, and routine(s) 1023, respectively. Note that some implementations may employ more, fewer, and/or alternative sources of training data.

In the depicted embodiment, training routine(s) 1021 produce a first trained preliminary machine learning model 1031. Once fully trained with training data 1011, preliminary model 1031 may be used as a starting point for training a second preliminary machine learning model 1032. The training of model 1032 starts by using a model having the architecture and parameter settings of trained model 1031 but refines the parameter settings by incorporating information from training data 1012. Training routine(s) 1022 use training data 1012 to adjust the parameter values in trained model 1031 to produce trained model 1032. Preliminary model 1032 is better able to predict process or process chamber behavior by accounting for the information content in data 1012. Processes that start with a first trained model by adopting the model's architecture and parameter values but change that model's parameter values using new or different training data are sometimes referred to as transfer learning processes.

In the depicted example, transfer learning is employed to adjust parameter settings in preliminary machine learning model 1032 to generate a final machine learning model 1503. Starting with trained model 1032, training routine(s) 1023 interpret training data 1013 to adjust the parameter values of model 1032 so that the resulting model, model 1033, is better able to predict reactor conditions or wafer properties similar to those present in the training data 1013.

Supervised and Unsupervised Learning

Supervised and/or unsupervised training may be employed to generate the denoising machine learning model and/or any of the preliminary or supporting models employed to produce a final version of the denoising machine learning model.

In embodiments employing supervised training, various types of information may be used as tags. Examples of tags include details about a pattern layout, high-resolution optical metrology data or optical metrology results, which results may capture information about actual values of wafer structure parameters, and microscopy results such as training wafer properties identified with electron microscopies such as CDSEM and/or X-ray microscopies.

Preliminary Model Examples

The following discussion presents examples of pre-training, supplemental, or preliminary models that may be generated incrementally, on the path to generating a final model for denoising optical beam metrology data. In certain embodiments, one or more of these trained models may be generated using data from a single training wafer that is relatively uniform across its surface. In certain embodiments, one or more of these trained models may be generated using data from a single training wafer that has non-uniform parameter values across its surface. One or more of these supplemental models may be trained as neural networks, autoencoders, and the like. In certain embodiments, one or more of these supplemental models may be trained using a supervised learning technique.

Pattern-Aware Pre-Training Model

A pattern-aware model may be used alone, or in combination with other training or other trained models to develop an overall machine learning model that can denoise input optical signals from, e.g., a large spot optical metrology tool. A pattern-aware model makes use of training information about the patterns or design layout for a wafer or one or more dies on a wafer.

Function

In certain embodiments, a pattern-informed machine learning model is trained to receive an arbitrary input of a large beam spot's spectra and, based at least partially on this input, predict where the beam reference point (e.g., the centroid of the beam) sits with respect to particular dies or patterns on the wafer. It may also predict the orientation of the pattern and/or die relative to a reference orientation such as a fixed orientation of the optical beam.

Figure 11:
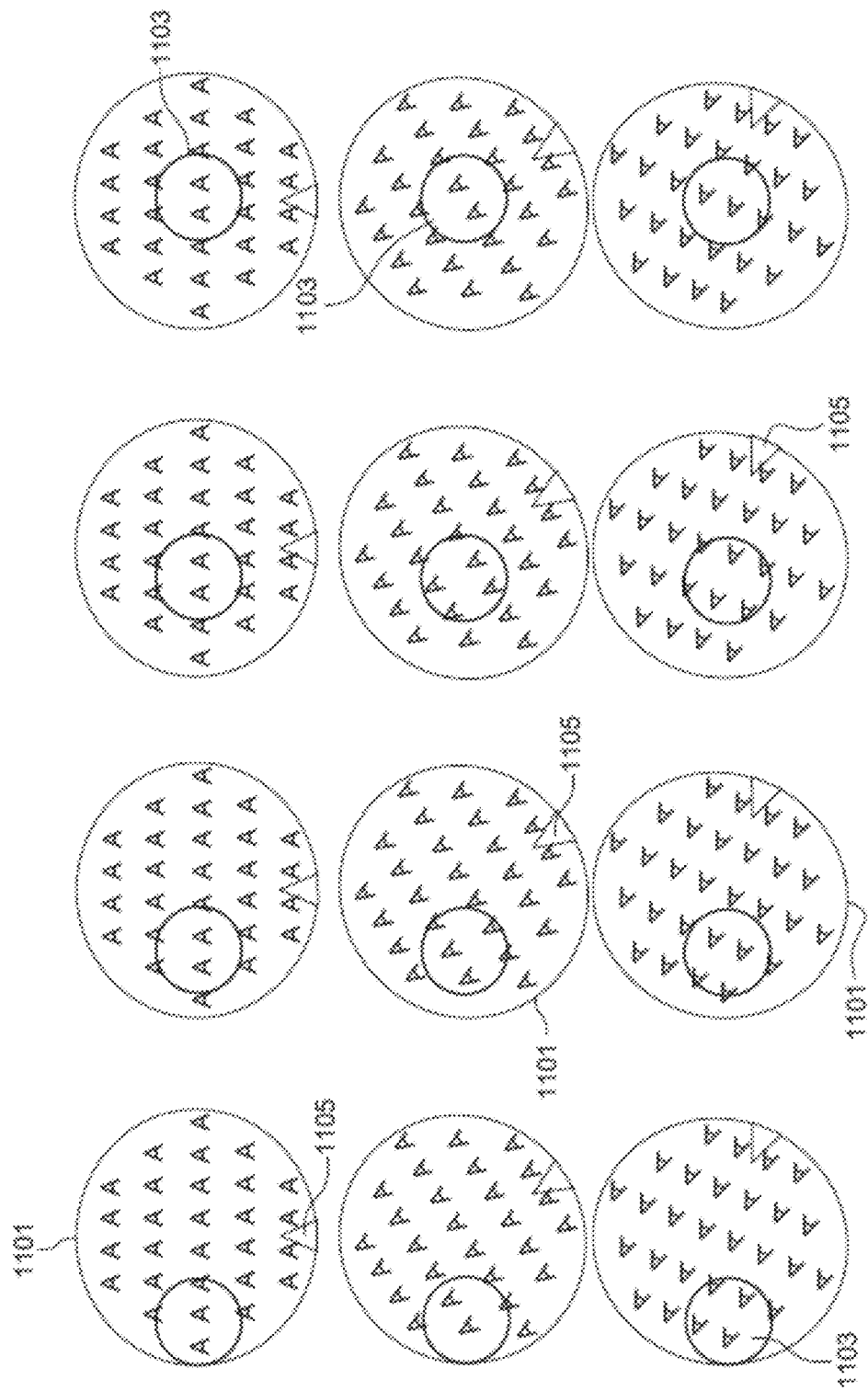
FIG. 11 illustrates how a repeating die or pattern on a wafer may be characterized with respect to a large beam spot.

FIG. 11 illustrates examples of how a repeating die or pattern on a wafer may be characterized with respect to a large beam spot. A single wafer 1101 and a beam spot 1103 from a single source are shown at twelve different combinations of relative position. In other words, the beam spot 1103 is shown with twelve different R and Θ positions on wafer 1101. On the wafer 1101, multiple repeating patterns are dies are represented by the letter "A." As can be seen in the top row, for example, the relative radial position of beam 1103 on the wafer 1101 brings the beam spot into proximity with different instances of die or pattern A. As the beam moves from the edge toward the center of the wafer, it subsumes different instances of A. At each beam position on wafer 1101, a different pattern or die, A, is closest to the centroid of beam spot 1103 or some other position on the beam spot. The pattern-informed model is trained to identify which pattern or die is closest to the beam spot (at a given fixed position) and optionally how close the beam spot is to the closest pattern or die.

The position and/or orientation of dies or patterns with respect to the metrology beam spot may be represented in various ways. In some cases, only the die or pattern that is closest to the beam position is considered. In other cases, multiple close die or pattern are considered. Various locations on a die or pattern may be used to represent the distance.

For example, the model may be trained to identify the distance between the beam spot and the centroid of the closest die. Or the model may be trained to identify the distance between the beam spot and the closest edge of a die. Of course, the beam spot may encompass some or all the dies or patterns that the model is trained to identify. Given the relative size of the beam and the dies or patterns on production wafers, the beam may overlap with the positions of two or more dies or patterns. As indicated, from the model's perspective, the beam position may be represented as a single spot within in the area of the beam.

FIG. 11 also illustrates how the orientation of a wafer may vary with respect to the orientation of a beam spot. This relative orientation may reflect, at least partially, the wafer's azimuthal position with respect to a reference orientation of the beam spot's orientation. As depicted in the second and third rows of FIG. 11, different azimuthal positions of the wafer 1101, as indicated by different azimuthal positions of a wafer notch 1105, produce different orientation of the patterns or dies A. These orientations vis-à-vis the orientation of the beam spot 1103, which may be assumed to be fixed in this example, may be captured by a pattern-informed machine learning model.

Training

In certain embodiments, the training is conducted using a design layout representing the individual patterns and dies on a wafer. The design layout may provide precise locations of line and other features making up the individual patterns on dies. The design layout may provide the relative positions and orientations of dies and patterns, as tags in a supervised learning methodology. In some cases, the information about the relative position of the dies or patterns with respect to the beam spot, optionally along with the orientation of the dies or patterns, is used as tags or ground truth for training this machine learning model.

In certain embodiments, a pattern-aware machine learning model is trained by using large spot optical metrology data obtained from a metrology tool identical to or similar to one that will be used for process control during operations on process wafers. In certain embodiments, metrology training data is collected from a single test/training wafer. In certain embodiments, the test or training wafer is processed in a way that resembles the process(es) leading to preprocessed production wafers that will be evaluated, during production, using the optical metrology and machine learning models described herein for process control of a downstream process or process chamber.

In some cases, the pattern-aware model is trained using data from a single training wafer, which may have been produced in a way that provides relatively little, if any, variation in the wafer structure parameter values over the face of the wafer. In certain embodiments, a training wafer (or wafers) has nominally uniform wafer structure parameter values (e.g., CD, layer thickness, layer optical properties) over the wafer's two-dimensional surface. The degree of uniformity may be qualified or quantified with respect to the ability of the large spot optical metrology tool to discern small variations in the values of any one or more of these wafer structure parameters. In some cases, a second type of training wafer is used in addition to or as an alternative to the "uniform" training wafer. This second type of training wafer is created using a so-called baseline process, where the process conditions represent a baseline process such as one used to fabricate production wafers. Surface variations in this type of training wafer may be viewed as the median of all process variations. It may not have as little variation as with the first type of training wafer or even as desired in a production setting, but may provide a robust training wafer, against which other variations may be evaluated.

During generation of a pattern-aware machine learning model, multiple data points (e.g., metrology captured spectra) are sampled over the surface of the one or more training wafers. Each sample signal may provide at least a portion of a unique training set member. In certain embodiments, the individual training data points are generated using relatively small changes in the overall position of the large beam spot on the wafer surface. The data spots may strongly overlap with one another. For example, the positions of the beam centroid in adjacent data points may be separated by about 1 millimeter or less.

Large spot optical metrology signals (as training data here) contain information about the impact of variations in wafer position on wafer structure parameter values. These signals also contain information about the dies or patterns that are subsumed within the area of the beam spot. This information includes the location, orientation, and/or fine structure of the patterns and dies.

The training data comprises complicated optical metrology signals from multiple positions on one or more wafers, where each metrology signal sample is associated with pattern-aware characteristics of the position of the beam spot such as detailed pattern information from the design layout at the position of the beam spot. It should be understood that polarized reflectance metrology signals may be more susceptible to and/or provide more clearly traceable pattern-originating contributions in the metrology signal.

A cost function may be used to train the pattern-aware machine learning model. In certain embodiments, a cost function is a weighted sum of the difference between actual and predicted values of the distance between the beam spot center and the center of the closest die as well as the orientation of the die or pattern under the beam spot.

Form of Model (Architecture)

In certain embodiments, a pattern-aware machine learning model has the form of a neural network. In some cases, this model is a trained neural network with which has the architecture of a variational autoencoder that will be used as a final version of the denoising machine learning model. In certain embodiments, the pattern-aware machine learning model has the form of a complete variational autoencoder with encoding and decoding portions, and portion between the encoder and decoder portions that provides a latent space representation.

In certain embodiments, this pattern-informed trained model may be a convolutional neural network or autoencoder. In some implementations, the model has a convolutional window at the front end of the neural network or autoencoder. The convolutional window may be configured to process wavelength or photon energy of input signals. The convolutional window of a neural network or autoencoder may be configured to convert wavelength-specific intensity into a first covariation matrix without wavelength info. In an autoencoder, a decoder convolution layer (located immediately before the autoencoder output) is configured to transform a latent space representation to intensity variations across the sample wavelengths.

In a transfer learning context such as one that trains a final denoising model by first training multiple preliminary models, the architecture, including layer structure, nodes, and hyperparameters, of the first preliminary model is preserved for a second preliminary model, if one is used, and a final machine learning model. Additionally, the presence and operation of one or more convolutional windows may be preserved across multiple models. So, the case of a pattern-aware model having a particular layer structure, hyperparameters, and/or convolutional window, these model structural features may be preserved when used with other models such as a pattern-independent machine learning model, a final denoising machine learning model, etc.

Pattern-Independent Preliminary Model

Another preliminary model that may be generated and used as part of the process to generate a final or full machine learning model makes use of metrology data, which may be characterized as high-resolution or otherwise high-quality metrology data. In various embodiments, this supplemental metrology data is acquired using a system that is not a large beam spot metrology system such as one used to conduct metrology on preprocessed production wafers for the purpose of process control in a downstream process chamber. In various embodiments, the supplemental metrology data provides "better" signal quality than that of the large beam spot metrology system. As examples, the signal quality may be superior because it has less noise, higher resolution, and/or higher accuracy. Increased accuracy may result from measuring a test structure fabricated on, e.g., a micron scale (e.g., about 40-100 micrometers) region of a wafer. In some training scenarios, the supplemental metrology data is used for supervised learning. The data may be used as a tag or ground truth for expected metrology signals at defined location on a training wafer surface. It should also be understood that in many implementations, small beam metrology is conducted by sampling from a defined map of X/Y locations that do not necessarily correspond to the sample positions of the large beam spot metrology. To enable the supervised learning of the pattern-independent model, small beam metrology data may need to be interpolated and/or extrapolated using, e.g., a spatial model treatment method (e.g., Zernike decomposition), so that the large beam spot metrology signals are paired with small beam spot metrology signals, which are treated as the ground truth in training.

In various embodiments, the supplemental metrology data is obtained using a relatively small beam spot. As examples, the beam spot may be about 1 millimeter or smaller, about 100 micrometers or smaller, or about 50 micrometers or smaller.

In certain embodiments, the pattern-independent machine learning model is trained such that, at any given position on a wafer surface, it can receive as inputs, a spectrum or other data obtained from a large beam spot metrology and predict a different spectrum approximating the spectrum that would be obtained using the supplemental metrology tool at the location of the large beam spot. Recognizing that the large beam spot is significantly larger than the small beam spot used to acquire the high-resolution signals, the "location" of the large beam spot may be defined to be a constant location within the large beam spot such as the centroid of the beam spot.

Training

In certain embodiments, training set data includes pairs of metrology data for defined positions on one or more training wafer surfaces. A pair of metrology data may include a large beam optical metrology spectrum and a small beam optical metrology spectrum, both acquired (or calculated) for a single position a wafer surface. One or both spectra are optionally provided with polarization data. In certain embodiments, the small beam spot metrology data is used as a tag or ground truth for supervised training of a pattern-independent model. This training data may be acquired from many sources. In certain embodiments, it is acquired from the same wafer(s) as used to collect training data for training the pattern-aware machine learning model. In certain embodiments, the training data is acquired from a wafer having nominally uniform values of the wafer structure parameters over the face of the wafer. In certain embodiments, the training data is acquired from a wafer having intentionally non-uniform values of the wafer structure parameters over the face of the wafer. There are many possible positions for training data to be acquired on a wafer surface.

In certain embodiments, the training data is optionally sampled for different pattern types (e.g., patterns having different feature sizes, orientations, regularity, and/or densities) or other locations informed by the design layout. In certain embodiments, the training data is optionally sampled at positions known to have different values of wafer structure parameters (CD, layer thickness, etc.)

The training data may have various metrology sample point densities or distributions over a training wafer's surface. In certain embodiments, fewer sample points on a given wafer are used for collecting supplemental metrology data (small beam spot size) than are used for collecting large beam spot metrology data. In certain embodiments, less than about 100 sample spots are used for collecting supplemental metrology data for a given training wafer. As mentioned, small beam metrology may be conducted by sampling from locations that do not correspond to the sample positions of the large beam spot metrology. Therefore, the small beam metrology data may need to be interpolated and/or extrapolated using, e.g., a spatial model treatment method.

Transfer Learning

In certain embodiments, a pattern-independent model is generated ab initio, without regard to prior training. In certain embodiments, a pattern-independent model is trained using another model such as a pattern-aware machine learning model, e.g., one described above. In this regard, transfer learning is optionally used.

In certain embodiments, a pattern-independent machine learning model is generated by transfer learning starting with a trained pattern-aware machine learning model. The current structure of the pre-trained pattern-aware machine learning model may have an architecture, along with hyperparameters, and previously trained weights and biases, which are preserved in the pattern-independent machine learning model, having the form of a trained convolutional neural network or convolutional variational autoencoder. As indicated, a trained pattern-aware model may be trained using information from a design layout that provides information about the relative position and/or orientation of one or more patterns or dies with respect to the beam spot on the wafer. In certain transfer learning embodiments, training employs training data comprised of pairs of spectra obtained from a large beam optical metrology system and a small beam optical metrology system.

In this pattern-independent machine learning model, the positions of the small beam metrology data on the wafer surface may not align to positions of the large beam spot metrology data, which is optionally used from training set for a different machine learning model such as the pattern-aware machine learning model described above. To this end, the training data from the supplemental metrology may be interpolated from other actual locations where metrology data was collected using the small beam metrology tool.

A spatial model may be employed for this interpolation from the positional data obtained with the supplemental metrology tool to the information obtained using the large beam spot metrology tool. In various embodiments, a spatial model is created to fit the first set of data points obtained by the supplemental metrology tool and provide a function or algorithm for calculating an expected metrology value at all locations on the wafer surface, not just those locations where the metrology data samples were acquired. In this way, the training algorithm can calculate the expected result of supplemental metrology sample at all locations where a large beam spot metrology sample is collected.

Supplemental Metrology Data and Associated System

In certain embodiments, the metrology tool can determine high-resolution and/or high accuracy information about the wafer structure parameter values that vary from position-to-position on the wafer surface. In certain embodiments, a training wafer for producing the supplemental metrology results may be produced in a manner that provides uniform values of the wafer structure parameters over the face of the wafer. However, due to intrinsic position-specific variability in fabrication processes, the training wafer does in fact have some variation, and that variation can be identified using a supplemental metrology tool. Hence, the spectra obtained at any given location by the supplemental metrology tool may be pattern-independent, i.e., it is not affected by pattern mixing or other noise of the types that may be introduced in large beam spot metrology. In various implementations, the supplemental metrology tool can determine, with a high degree of resolution, values of the wafer structure parameters over the face of a training wafer. It should be understood that many types of small beam spot metrologies such as standalone metrologies employ measurements at wafer locations that have "patterns." But these are patterns are typically periodic and often within the micron scale domain (e.g., in a 40 micrometer scale), consistent with the small spot beam size. All the pattern mixing refers the diversity of the pattern under a large beam spot (e.g., within about a 10 mm spot).

Examples, of small beam metrology tools that are suitable for producing the supplemental training data described herein include various tools available from metrology tool companies such as KLA Corporation, of Milpitas, Calif., and Onto Innovation of Milpitas, Calif.

Example Process Flow

In certain embodiments, a pattern-independent machine learning model is generated as follows.

First, supplemental metrology values are collected from a series of points of a training wafer surface. These points may or may not correspond to points where the large beam spot data was collected. Even if they do not correspond, the spectral response of the standalone metrology values can be interpolated over the face of the wafer, optionally using a spatial model to facilitate this interpolation.

Second, large beam spot metrology is conducted on the training wafer. This metrology produces spectra from many various locations on the training wafer. Optionally the same large beam spot metrology data used to train another model such as the pattern-aware machine learning model is used to train this pattern-independent machine learning model. Each large beam metrology spectrum has an associated locational index (e.g., R, Θ), which may or may not exactly correspond with the location of a supplemental metrology sample. As mentioned, the supplemental metrology spectra may be interpolated to provide calculated supplemental metrology spectra at locations of the large beam spot metrology values. Regardless, training data is generated from pairs of the large beam and supplemental metrology spectra at defined locations on the wafer surface. Thus, each of multiple locations are provided with two spectra, one spectrum from the large beam spot metrology that was actually performed at that the location, and another spectrum from the supplemental metrology that was either actually performed at the location or was generated by interpolation. In other embodiments, the multiple locations include locations where the supplemental metrology was actually performed. Thus, the actual spectrum obtained via the supplemental metrology tool may be incorporated in the training data point, and an interpolated spectrum of the large beam spot data may be incorporated in the same training data point. Thus, in some implementations, only the supplemental metrology data is interpolated, in some other implementations, only the large beam spot metrology data is interpolated, and in still other implementations, both the supplementation metrology data and the large beam spot metrology data are interpolated.

In each pair of spectra used for training, the spectrum from the supplemental metrology system is used as a tag for supervised learning of the pattern-independent machine learning model.

Stated another way, the pattern-independent model is trained so that at any given position on the wafer surface, data obtained from a large beam spot metrology can be converted to a different spectrum approximating the spectrum that would be obtained using the supplemental metrology tool at the location of the large beam spot. And as mentioned, the supplemental metrology data can be generated by a system that is at least somewhat immune from noise such as pattern mixing, and can produce spectra that capture, with high-resolution, variations in the wafer structure parameter values over the surface of a wafer.

Fully Trained or Complete/Final Model (Wafer Variational Model)

In certain embodiments, a wafer variational machine learning model is trained using a training set comprised of data from one or more training wafers having non-uniform wafer structure parameter values distributed over their surface areas. In certain embodiments, a wafer variational machine learning model is trained a priori, without using transfer learning or information from any other trained model. In certain embodiments, a wafer variational machine learning model is trained using transfer learning from one or more supplemental or supporting models such as a pattern-aware or pattern-independent models as described above. In certain embodiments, training of the wafer variational model is conducted without using pattern information such as a design layout.

With or without pretraining via supplemental or supporting models, a wafer variational model may be generated using a training set comprised of data from one or more wafers having non-uniform wafer structure parameter values over the area of the training wafers. In certain embodiments, the training is unsupervised. A goal of such training may be identifying a latent space projection of input metrology variables (e.g., spectral and wafer positional variables on a per wafer basis) that groups data from the training set based on common characteristics.

The wafer variational machine learning model may be trained for use in process control during processing of production wafers. As indicated, the model may be trained to denoise input metrology data, such as large beam spot metrology data.

Training Set

As with other models described above, training data includes spectra from individual beam spots collected over two-dimensional surfaces of one or more training wafers. Collectively these spectra serve as the training set for a wafer variational model. However, while the spectra used to train one or more of the models described above may be obtained from a single wafer that is produced in a way that is not intended to have significant variation in a design relevant parameter values (e.g., CD and/or layer properties) over the face of the wafer, training data for this wafer variational machine learning model may be obtained from multiple training wafers having a wide variety of parameter properties distributed over their surfaces. Thus, in certain embodiments, this phase of training utilizes training wafers having radial and/or azimuthal variations in the wafer structure parameters values. In certain embodiments, the training wafers are preprocessed wafers that are intentionally produced under various conditions to produce variations in the wafer structure parameter values over the face of the wafers. In certain embodiments, the training wafers have surface variations or are produced in manner that may produce surface variations using a design of experiment methodology. For example, DOE may provide information on how one or more properties of the wafer surface such as CD or layer properties vary as a function of position on the wafer surface (R, $\Theta$ or X, Y). In some cases, DOE is used to specify a pretreatment process such as a two-dimensional distribution of temperatures or heating profiles to individual heating elements in a two-dimensional array under the wafer surface.

Transfer Learning

In certain embodiments, a wafer variational model is trained using information from one or more other models, which may have been earlier trained models such as pattern-aware and/or small beam spot metrology models.

In certain embodiments, a fully trained pattern-aware model is used as a starting point for training the wafer variational model. In certain embodiments, a fully trained pattern-independent model is used as a starting point for training the wafer variational model. Starting with the architecture and parameters values of the preliminary model, regardless of how it was trained, the training process modifies adjustable parameters of the model through further training. The architecture, including the layer and node arrangements as well as any hyperparameters, of the original model may remain fixed through this additional learning process.

Model Form

In the inputs and outputs of a wafer variational model may be selected from among the inputs and outputs described above for de-noising models. In various embodiments, the inputs are spectra and optionally other optical information from large beam spot metrology. In certain embodiments, the outputs are or include an abstract representation of the input metrology data in a latent space. In certain embodiments, the output is a decoded version of the input data, which output is provided from a decoder portion of an autoencoder is a spectrum In certain embodiments, the wafer variational machine learning model is a multilayer model having the form of a neural network or an autoencoder such as a variational autoencoder. In certain embodiments, the wafer variational machine learning model has at least five layers. In certain embodiments, the wafer variational machine learning model has at least about 5 nodes. In certain embodiments, a wafer variational machine learning model contains about 3 to 20 layers. In certain embodiments, the input layer of the wafer variational machine learning model has at least about 5 nodes.

In various embodiments, the wafer variational model has a convolutional layer. In some cases, the convolutional layer is configured to filter wavelength and/or photon energy information. The convolution layer may be configured to extract relevant features from the input data such as multi-wavelength characteristics of in the input data.

In various embodiments, a wafer variational model defines a latent space representation of the optical metrology input signals. The latent space is a multidimensional space having a reduced number of dimensions in comparison to the input data, e.g., the spectra from large beam optical metrology conducted on a wafer. The data space of the raw metrology data (e.g., intensity as a function of wavelength) is understandable in terms of the physical reality of the metrology. For example, the raw data has dimensions corresponding to various wavelengths of the input spectra. By contrast, the latent space representation is an inherently abstract representation of the input data and is not easily understandable in terms of the underlying physical dimensions such as wavelength, intensity, polarization, etc. Nevertheless, the latent space representation of the data may embed the information content from the spectra, noise, multiple wafer structure parameters, etc. And the physical construction of the spectra may be decoded by an appropriately trained decoder. Without using a decoder, it tends to be difficult or impossible to discern what the physical contributions are to the data contained in the latent dimensional space. In certain embodiments, the latent space is determined using a machine learning model such as a neural network or a variational autoencoder.

In certain embodiments, the wafer variational model outputs wafer metrology information presented in the latent space of a variational autoencoder or other a machine learning model. In some implementations, the data in the latent dimensional space serves as an input into a different machine learning model, one that can predict physical properties of a post-processed wafer and/or define process chamber settings for processing a preprocessed wafer to achieve target settings.

Figure 12:
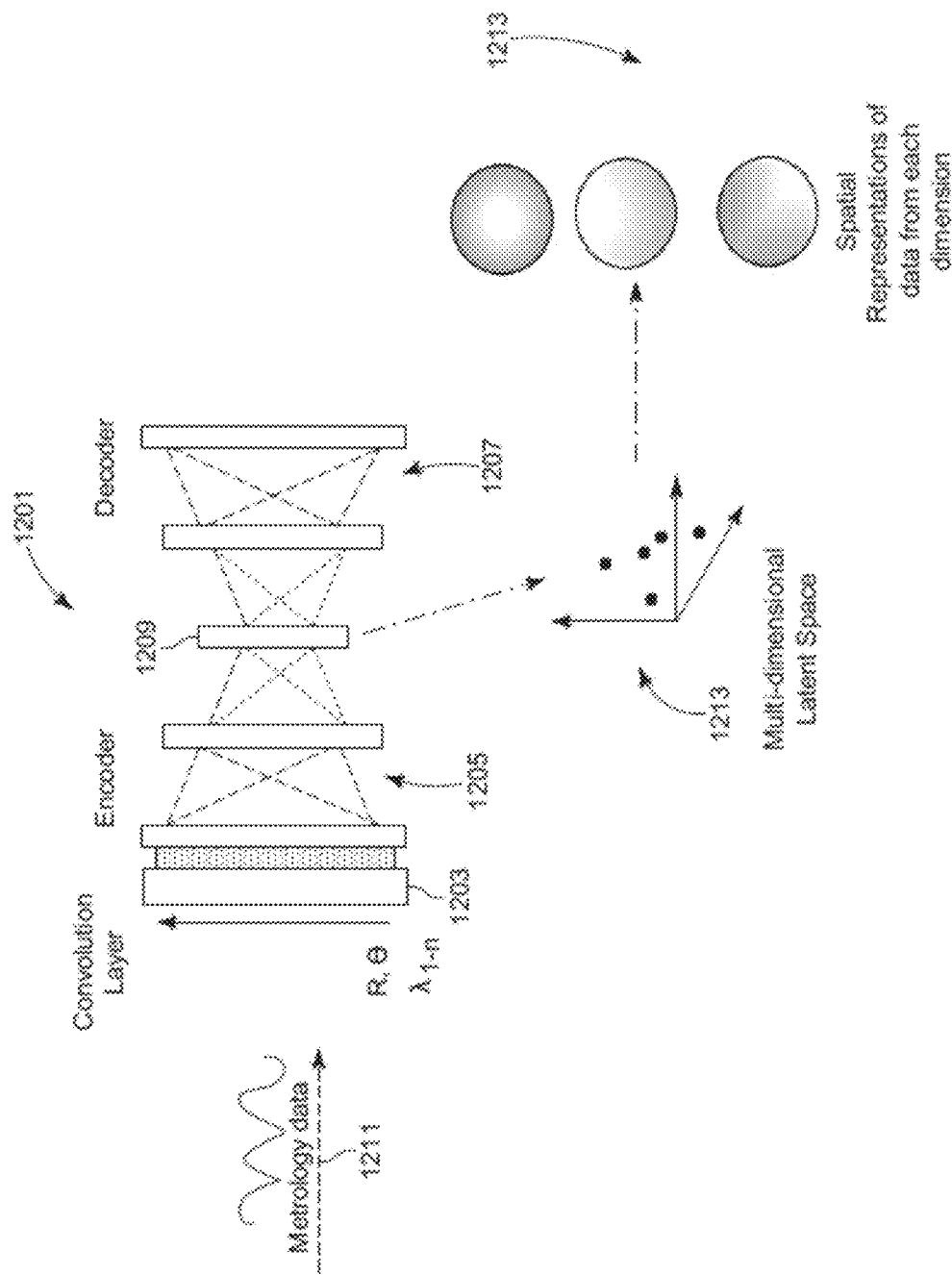
FIG. 12 illustrates an example architecture and some functions of a variational autoencoder that may serve as a denoising machine learning model.

FIG. 12 illustrates an example architecture and some functions of a variational autoencoder that may serve as a wafer variational machine learning model as described in this section. As illustrated, a variational autoencoder 1201 includes a convolution layer 1203 at an input side, a multilayer encoder portion 1205, a multilayer decoder portion 1207, and a hidden or latent space portion 1209. Variational autoencoder 1201 is configured to receive metrology data 1211 acquired from a wafer (e.g., a preprocessed production wafer). The input metrology data 1211 may be provided in the form spectra obtained from various positions (R, $\Theta$) on the wafer surface. The metrology input data is organized an provided to the convolution layer 1203, which is configured to extract potentially relevant features from the spectra or other metrology data. Variational autoencoder 1201 is configured such that the metrology data filtered by convolution layer 1203 is processed by the encoder layers 1205 and decoded by the decoder layers 1207. Between the encoder and decoder portions is a hidden layer 1209 configured to hold the fully encoded metrology data in a latent space.

In the depicted embodiment, the hidden or latent space portion 1209 holds a multi-dimensional latent space representation 1211 of the fully encoded data. The latent space representation 1211 comprises multiple data points, each associated with a particular location on the wafer surface. This locational information permits the latent space data to be provided in spatial representations 1213 such as Zernike polynomials. In certain embodiments, each dimension of latent space 1211 is provided as a separate spatial model.

As indicated, the information output by the wafer variational machine learning model contains the unique beam position from which the data was derived. As explained, through the training of the wafer variational model one or more machine learning models used to provide metrology denoising model, the positional information of the beam spot with respect to the wafer is preserved. For example, an R, $\Theta$ value associate with each beam spot is preserved as an index through the entire processes of encoding and latent variable space representation of the metrology data.

Training

Training a wafer variational model can be conducted in various ways. As explained, the training may be conducted with training wafers that have been produced in a way that produces a distribution of wafer structure parameter values over their surfaces. The training may be conducted in a conventional way that adjusts connections between nodes in adjacent layers of a neural network or autoencoder. The training may also be conducted in a way that selects certain dimensions and removes unselected dimensions from the latent space of the wafer variational model. The training may be conducted with a cost function that reduces the variation between input and output spectra of an autoencoder and/or reduces latent loss by regularizing the latent dimensions into a Gaussian or other distribution. A goal of the training process may be to find a small but effective set of dimensions in the latent space of the model, which may be expressed in the form of mean and standard deviation vectors of, e.g., a Gaussian distribution. The process may be conducted iteratively by removing particular dimensions or groups of dimensions and determining whether the model still outputs sufficiently accurate representations of the incoming metrology data.

Figure 13:
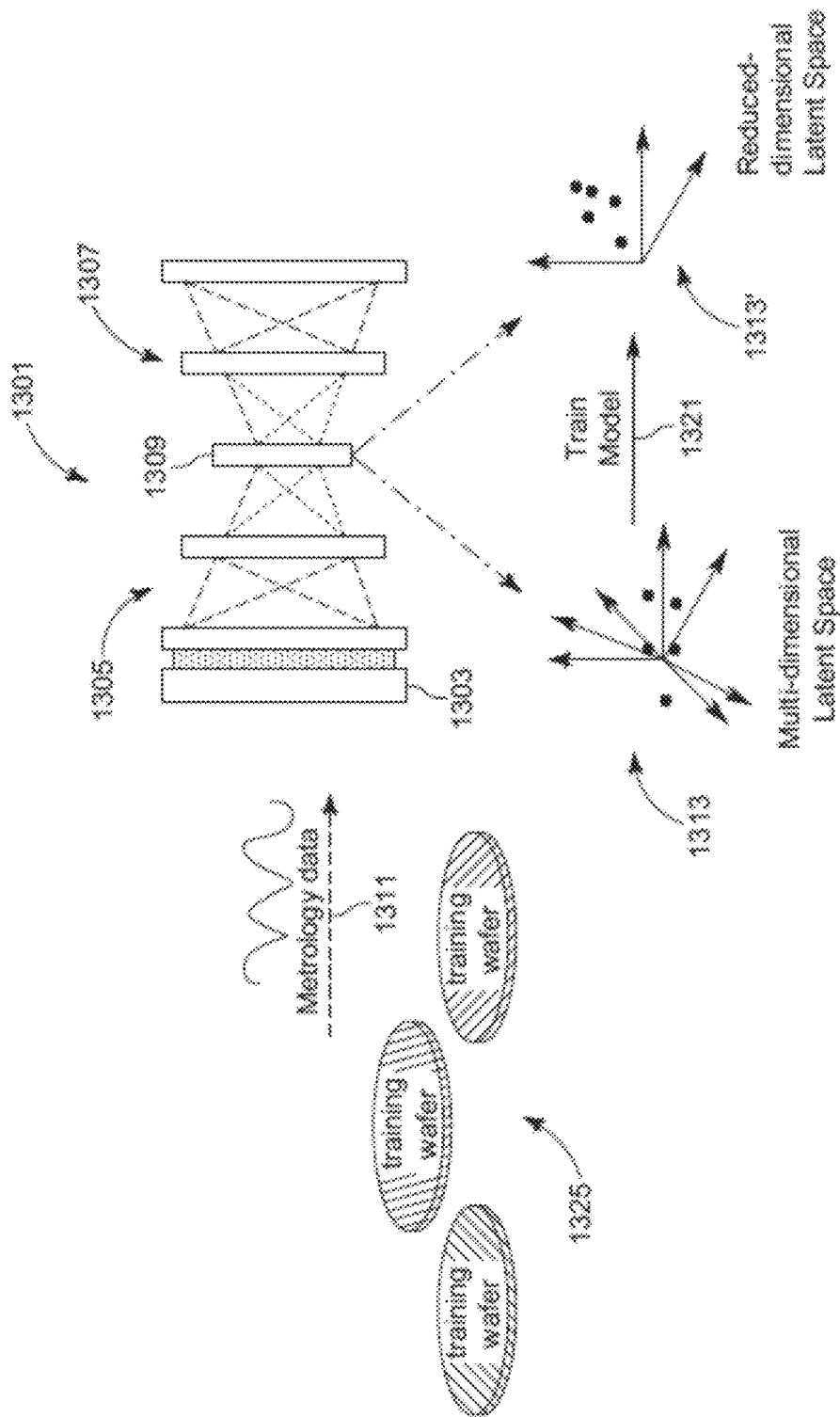
FIG. 13 illustrates a representation of training a variational autoencoder having an architecture that includes a convolution layer at an input side, a multilayer encoder portion, a multilayer decoder portion, and a hidden or latent space portion.

FIG. 13 illustrates an example representation of training a variational autoencoder 1301. The example shows an architecture that includes a convolution layer 1303 at an input side, a multilayer encoder portion 1305, a multilayer decoder portion 1307, and a hidden or latent space portion 1309. During training variational autoencoder 1301 is configured to receive metrology data 1311 acquired from a plurality training wafers 1325 having various distributions of surface properties, e.g., various distributions of wafer structure parameter values. In certain embodiments, training wafers 1325 have feature distributions intentionally developed by following a DOE methodology. The input metrology data 1211 may be provided in the form spectra obtained from various positions (R, $\Theta$) on the training wafer surfaces.

During training, a cost function may be applied to reduce the variation between the input and output spectra of the autoencoder. Through this training process, the training routine determines the number and choice of dimensions to preserve from an initial multi-latent space 1313. Through training, the dimensions that contain the most useful information content from the input metrology data are selected for a final model. A multidimensional latent space 1313' learned through this training has a reduced number of dimensions compared to the initial multi-dimensional latent space.

Generating Zernike Polynomials of Other Spatial Representation of Data in Latent Space While the wafer variational model receives spectra and optionally other metrology data from many positions over the face of the wafer under consideration, those spectra and other data are projected into the latent space, which has dimensions not directly related to the wavelength-intensity values and other metrology data. Thus, in various embodiments, an output of the wafer variational model is a spatial representation of the input metrology data in a reduced dimensional space such as the latent space of an autoencoder. In some implementation, a separate spatial representation is created for each dimension of a multi-dimensional latent space. In other embodiments, the latent space representation from the wafer variational model is used as is.

The latent space includes individual data points for the individual locations on the wafer surface where the spectra were acquired. Each dimension of the latent space has a distribution of points, each associated with a single position on the wafer surface. A distribution of positionally discrete points on any latent dimension may be converted into a two-dimensional representation corresponding to the physical dimensions of a wafer such as a Zernike representation in polar coordinates. Thus, in operation, a wafer variational model may, for any given production wafer under consideration, output a plurality of Zernike representations of the latent space, with a different Zernike representation provided for each dimension in latent space.

Process Settings Machine Learning Model

In certain embodiments, a process settings machine learning model is configured to generate setpoints or other information for controlling multiple spatial elements of a position selective activation component (e.g., the multiple heating cells of a Lam Research Hydra® chuck) and/or other process control parameter settings such as chamber process, gas flow rate, plasma power, etc. The settings are predicted to produce a postprocessed wafer having a target spatial distribution of wafer structure parameter values (e.g., a distribution of CD or layer thickness values). In some embodiments, a process settings model is configured to output predicted information about wafer structure parameter values over the surface of a wafer when its processing is complete. Process settings models effectively model the impact of a particular fabrication process (e.g., a particular etching or deposition process) on preprocessed wafer. Process settings models are configured to receive metrology data collected from wafers before they are subjected to the fabrication process (i.e., the data is collected on preprocessed wafers).

In certain embodiments, the process settings machine learning model is provided in a pipeline with a denoising machine learning model. During fabrication of electrical devices, a metrology tool may collect large spot size metrology data from a preprocessed wafer and provide that data to a denoising machine learning model that removes some noise from the metrology data. The denoised large beam spot metrology data may then be provided to a process settings machine learning model that uses the denoised metrology data to determine process settings and/or a postprocessed wafer structure parameter value distribution for the wafer under consideration.

A process settings machine learning model may be implemented as logic that executes on computer hardware such as that described elsewhere herein, e.g., in connection with the discussion of FIG. 8, control systems, etc.

The input to the process settings machine learning model may be multivariate data. The model may be configured to receive spectral information from one or multiple large beam spot metrology samples of a preprocessed wafer. The model may also be configured to receive other variables such as required process conditions to be applied when processing the wafer. The process settings model may output multivariate information such as temperature set points for a plurality of heater cells in a wafer chuck. The outputs may include other process settings, which may not be otherwise fixed or required, such as, in some cases, chamber pressure, a chamber plasma conditions, and a process gas flow condition. These outputs may be utilized in a feedforward control system to set or adjust process conditions.

Integration of Process Settings Models in Process Control

Figure 14:
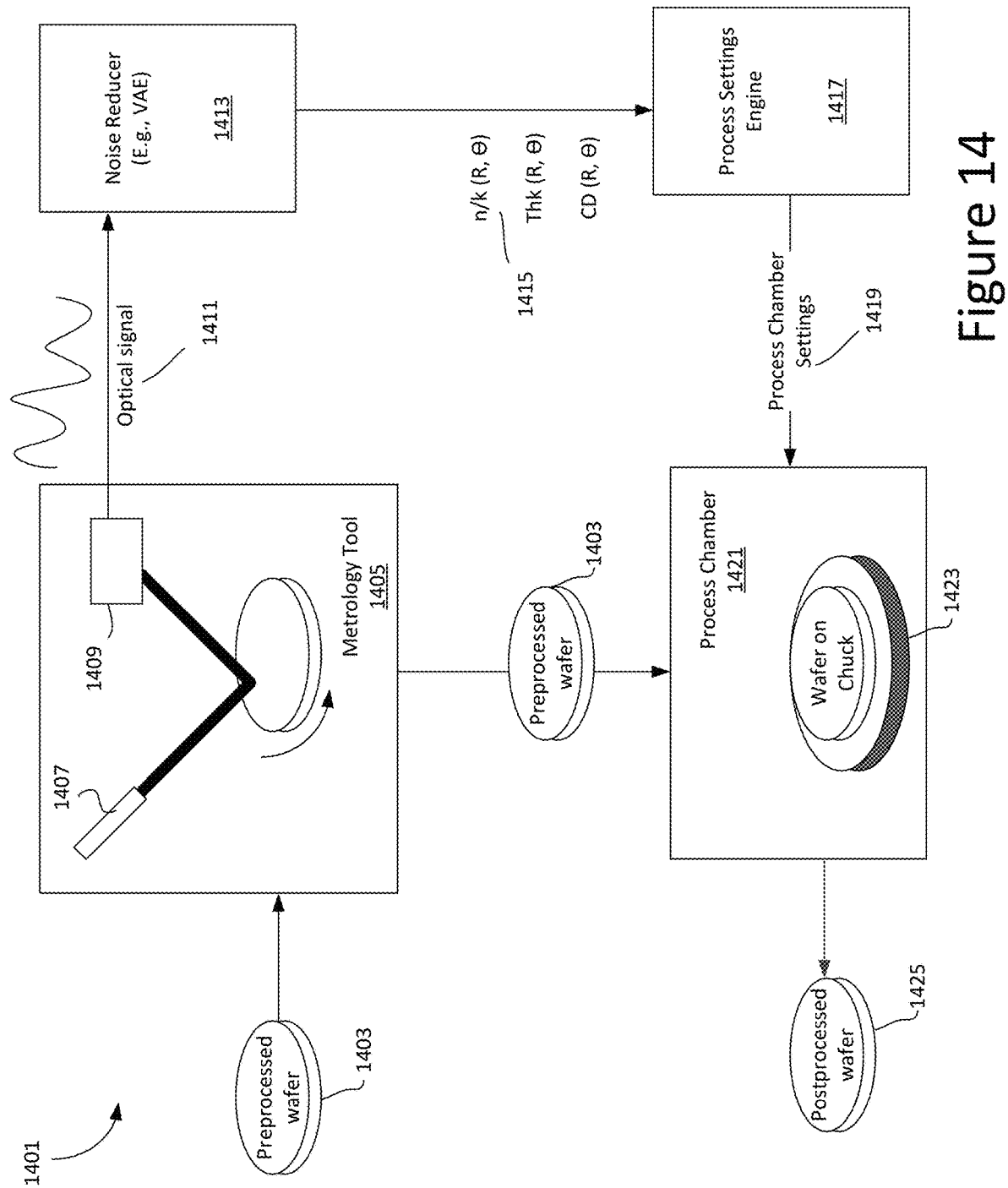
FIG. 14 illustrates a process settings engine comprising a process settings machine learning model that is configured to receive metrology information for a preprocessed wafer and predict information about the processed surface of the wafer after processing (e.g., the postprocessed wafer).

FIG. 14 presents an example system 1401 for adjusting process conditions to account for spatial distributions of wafer structure parameter values in preprocessed wafers. In the depicted embodiment, system 1401 includes a metrology tool 1405 and a process chamber 1421 that work together to evaluate and process a preprocessed wafer 1403. As shown, preprocessed wafer 1403 enters metrology tool 1405 where it is inspected using a large spot optical beam from a source 1407 and a detector 1409. An optical signal 1411 obtained from metrology tool 1405 is introduced to a noise reducer 1413, which may be a denoising machine learning model such as described elsewhere herein. In some implementations, noise reducer 1413 is a variational autoencoder. The output of noise reducer 1413 is a denoised optical metrology signal 1415 that includes, at least in an abstract representation, position dependent information about the wafer structure of preprocessed wafer 1403. This information may be provided in the form of spectral reflectometry signals as a function of R and $\ominus$ or X and Y on the surface of preprocessed wafer 1403. As indicated, wafer structural parameters may include geometric parameters such as critical dimension, trench depth, sidewall angle, tilt, and overlay. Wafer structural parameters may also or alternatively include physical properties of layers on a wafer such as a layer thickness and layer dispersive properties (e.g., n and k). Wafer structural parameters influence the optical signals collected from illumination of the wafer—and subsequently denoised—using a large spot optical beam.

Regardless of the types of information contained in denoised output data 1415, the data is provided to a process settings engine 1417. Process settings engine 1417 is configured to directly or indirectly determine process chamber settings from input data 1415. At least one of these process settings may be settings or information about settings for elements of a position selective activation component such as a multi-heater wafer chuck.

As depicted, process settings engine 1417 is configured to output process chamber settings 1419 and deliver them to the process chamber 1421, where they are applied for processing preprocessed wafer 1403. As illustrated, process chamber 1421 includes a wafer chuck 1423 that may include multiple independently controllable temperature settings for controlling the two-dimensional temperature distribution on wafer 1403.

After processing wafer 1403 using settings 1419 applied to chamber 1421, the wafer is removed from chamber 1421 and is now a postprocessed wafer 1425 having a target distribution of wafer structure parameter values. The metrology tool 1405 in conjunction with computational noise reducer 1413 and computational process settings engine 1417 determine process chamber settings that allow process chamber 1421 to process preprocessed wafer 1403 so that postprocessed wafer 1425 has the target distribution of wafer structure parameter values.

A process settings engine such as the one illustrated in FIG. 14 may contain one or more computational elements, at least one of which is a process settings machine learning model that is configured to receive metrology information for a preprocessed wafer and predict information about the processed surface of the wafer after processing (e.g., the postprocessed wafer). In certain embodiments, the process settings engine is configured to receive denoised metrology information about the preprocessed wafer. The process settings machine learning model is trained to predict, at least partially, information about the impact of the processing on the processed surface of the preprocessed wafer. The information about the impact of the processing may be, for example, predicted metrology information about the postprocessed wafer, predicted surface structural properties of the postprocessed wafer, and the like. The process settings engine may include one or more additional computational components that work in conjunction with the machine learning model. Such additional components may identify process settings based on predicted impacts of processing. As an example, an additional computational component may be a non-linear regression component configured to iteratively receive the machine learning model's information about the predicted impact of the processing, and, based on that information, adjust process settings information to the input of the machine learning model.

There are at least two approaches to determining process settings from the output of a process setting machine learning model. One approach uses the output directly. This assumes that the process settings model is configured to output process settings, such as settings for multiple elements of a position selective activation component. Another approach employs a process settings model that outputs information about the postprocessed wafer such as a distribution of metrology readings (e.g., spectra) on the post processed wafer or a distribution of wafer structure parameter values on the postprocessed wafer. In this second approach, the direct output of the process settings machine learning model may be a physical or optical map or model of a wafer surface reflecting the distribution of predicted optical metrology signals or physical parameter values (e.g., wafer structure parameters such as CD, feature depth, and/or physical properties of a layer) as a function of wafer position (e.g., R and $\ominus$). This output is based on model inputs that include a defined set of process conditions such as position selective activation settings (e.g., temperature settings in a multi-cell wafer chuck) over the preprocessed wafer surface. Therefore, in order to find a set of process conditions that produce a target output distribution of wafer structure parameter values—which is typically different than the initially predicted distribution of such values—the model may be used iteratively. In certain embodiments, each iteration includes (a) computationally specifying process conditions including position selective activation component settings (e.g., heater settings or temperature values for each of many cells in a wafer chuck) over the wafer surface, (b) inputting the process conditions specified in (a) to the process settings machine learning model and receiving from a the model a predicted distribution of postprocessed metrology values or wafer structure parameter values over the surface of the postprocessed wafer, (c) comparing the predicted distribution of metrology values or wafer structure parameter values to a target distribution of metrology values or wafer structure parameter values; (d) applying a cost function to differences between the predicted and target distribution of values, and (e) using the result of the cost function to adjust the computationally specified process conditions for the next iteration. Each iteration includes a convergence check. At convergence, the process settings include settings of individual elements or positions in a position selective activation component for creating a two-dimensional distribution of a process condition over the wafer surface.

As mentioned, the process settings machine learning model may be configured so that the direct output of the model is a set of process conditions including settings of individual elements or positions in a position selective activation component for creating a two-dimensional distribution of a process condition over the wafer surface. These process conditions may be directly applicable to the process. As an example, the process settings model may be configured to output the temperature-control settings for each cell of a two-dimensional heater array in a wafer chuck. The process settings model is configured such that a process conducted with output settings will generate a postprocessed wafer having a target distribution of wafer structure parameter values. The input to this version of a process settings model includes target values for the distribution of wafer structure parameter values.

Note that while a process settings machine learning model may output information about settings for the process conditions (notably information about settings for individual elements of a position selective activation component), the output information need not be the actual settings value. In the case of a wafer chuck with an array of heating elements, for example, the information about settings may be temperature values for the individual heating elements, temperature values of the wafer regions adjacent to the individual heating elements, or some other information related to the temperature values of the individual heating elements. As an example, such information does not directly specify process settings applied to the individual heating elements. The actual process settings may be, for example, electrical power values (e.g., controlled voltage or current values) applied to the individual heating elements. In some implementations, the actual process settings are duty cycle values for applying voltage or current to individual heating elements. The duty cycle values represent the portion of time that the controlled current or voltage is applied to the heating elements. The duty cycle values reflect the amount of heat produced by the associated heating elements. If the machine learning model does not output the process setting values directly, some other computational element may be configured to translate the direct output to process settings. For example, the computational element may be configured to translate temperature values output the machine learning model to voltage duty cycle values for applying to the heating elements. In some embodiments, the process settings machine learning model is configured to output the actual process settings for the position selective activation component.

Process Settings Model Configuration

In various embodiments, a process settings model is configured to receive denoised large beam spot metrology data over two dimensions on a preprocessed wafer and output either (a) process conditions for converting the preprocessed wafer to a postprocessed wafer having a target distribution of wafer structure parameter values, or (b) a distribution of wafer structure parameter values (or metrology values that would result from such wafer structure parameter values) in a postprocessed wafer that processed using process settings that are provided as inputs to the process settings model. Beyond this, there are many ways the process settings model may be configured.

A process settings machine learning model may be configured to accept inputs having one, some, or all the following characteristics.

When using a trained process settings model, inputs include at least large beam spot metrology data from a preprocessed wafer for which process control information is to be generated. The trained model may also be configured to receive other inputs such as process settings for the process chamber that will process the wafer. When training a process settings model, the training data includes large beam spot metrology data from preprocessed wafers and any other information that will serve as inputs to the trained model. In addition, the training data my include wafer structure parameter values from postprocessed wafers that have been subject to the process being modeled.

Input data includes information from large beam spot optical metrology of a preprocessed wafer. In various embodiments, the large beam spot optical metrology is cleansed or denoised with a denoising machine learning model such as described elsewhere herein. Only after denoising is the metrology data used as an input. In some embodiments, the denoised large beam spot optical metrology data takes the form of latent dimension values obtained from a denoising machine learning model such a variational autoencoder such as described elsewhere herein. In some embodiments, the denoised large beam spot optical metrology data takes the form of broadband reflectometry signals, albeit denoised signals. The denoised large beam spot optical metrology data reflects variations in wafer structure parameter values over the surface of a preprocessed wafer. The large beam spot optical metrology data may be provided in the form of a spatial model comprising one or more mathematical expressions or algorithms that can provide the large beam metrology data values (e.g., in the form of latent dimensions) for any arbitrarily input location on a wafer surface. In some implementations, the input large beam metrology data is provided in the form of Zernike models. In some embodiments, the large beam spot optical metrology data is provided in a point-by-point format, with metrology values being provided only at certain defined locations on a wafer surface.

The input data optionally includes process control values such as process gas flow information and plasma conditions. Examples of process gas flow information include gas composition, gas flow rate, and pressure in the process chamber. Examples of plasma conditions include plasma power and plasma density. In some cases, the model is configured to receive information about settings of a position selective activation component such as a multi-heater wafer chuck or a phased array of microwave antennas. It should be understood that even if the process apparatus comprises a position selective activation component and all elements of such component are set to the same value, postprocessed wafer structure parameters may not be spatially uniform. Gas flow, plasma electrode performance, and other process chamber components and process conditions may inherently introduce some non-uniformity in two dimensions, R and $\Theta$.

The input data may include equipment sensor and/or process settings (e.g., time and temperatures) for processing operations that are performed before the process operation that is modeled. For example, an etch process may employ a multi-step process in a given process chamber, and initial steps may not employ not employ variations in settings of a position selective activation component. In this example, only a later step is controlled with the position selective activation component, and this later step is modeled by the machine learning model.

In certain embodiments, the input data includes a spatial model of parameter values over a wafer surface. The parameter values may be any of those controlled by a position selective activation component. As an example, the spatial model may represent wafer temperature distributions produced by a wafer chuck having a two-dimensional array of heaters. The spatial model calculates and outputs temperature or other parameter value under consideration over the entire wafer surface, not just at positions of discrete control such as positions of heaters in the chuck. In some embodiments, a process settings model is configured to receive as inputs actual wafer temperature values at locations separated from locations of heater elements. In such cases, the heater element settings may be provided to a spatial temperature model that provides temperature values at locations expected by the process settings model. Such models may be configured to account for thermal properties and geometries of heating cells, wafers, and/or support structures (e.g., chucks).

For training purposes, metrology results of postprocessed training wafers may be used. These results may be used as tags, for example, in supervised training. In certain embodiments, small beam spot metrology may be employed. As an example, a supplemental metrology as described when discussing training a denoising machine learning model may be employed.

A process settings machine learning model may be configured to generate outputs having one, some, or all the following characteristics.

Outputs of the process settings machine learning model may be used to determine or control process settings that produce a postprocessed wafer having a target distribution of wafer structure parameter values. The settings may be for a position selective activation component and/or for other process chamber settings such as pressure, process gas flow parameters, and/or plasma parameters. In certain embodiments, the direct output of the process settings model contains these process settings values. In certain embodiments, the direct output of the process settings model contains information (e.g., temperature values) that must be converted to actual process settings values (e.g., duty cycle values to individual heating elements). In some embodiments, the direct output of the process settings model contains predicted wafer structure parameter values over the surface of a postprocessed wafer. In some embodiments, the direct output of the process settings model contains predicted optical metrology readings over the surface of a postprocessed wafer. These metrology or wafer structure parameter values may be interpreted or processed in a manner that allows a system to determine, from them, process settings values for the process that is about to convert a preprocessed wafer to a postprocessed wafer. Because optical metrology readings taken from a postprocessed wafer contain information about wafer structure parameter values, references herein to process settings model outputs containing wafer structure parameter values may be assumed to include, as examples, process settings model outputs containing optical metrology values.

Types of Model Architectures

Examples of machine learning model types that may be used for the process settings machine learning model include neural networks, including recurrent neural networks and convolutional neural networks, autoencoders, including variational autoencoders, random forests models, restricted Boltzmann machines, recurrent tensor networks, and gradient boosted trees. Input nodes may include those for (a) each of multiple latent dimensions in a trained denoising model for processing large beam spot metrology data, and (b) one or more other process settings. When designed as a neural network or autoencoder, the process settings model may have three or more layers.

Figure 15:
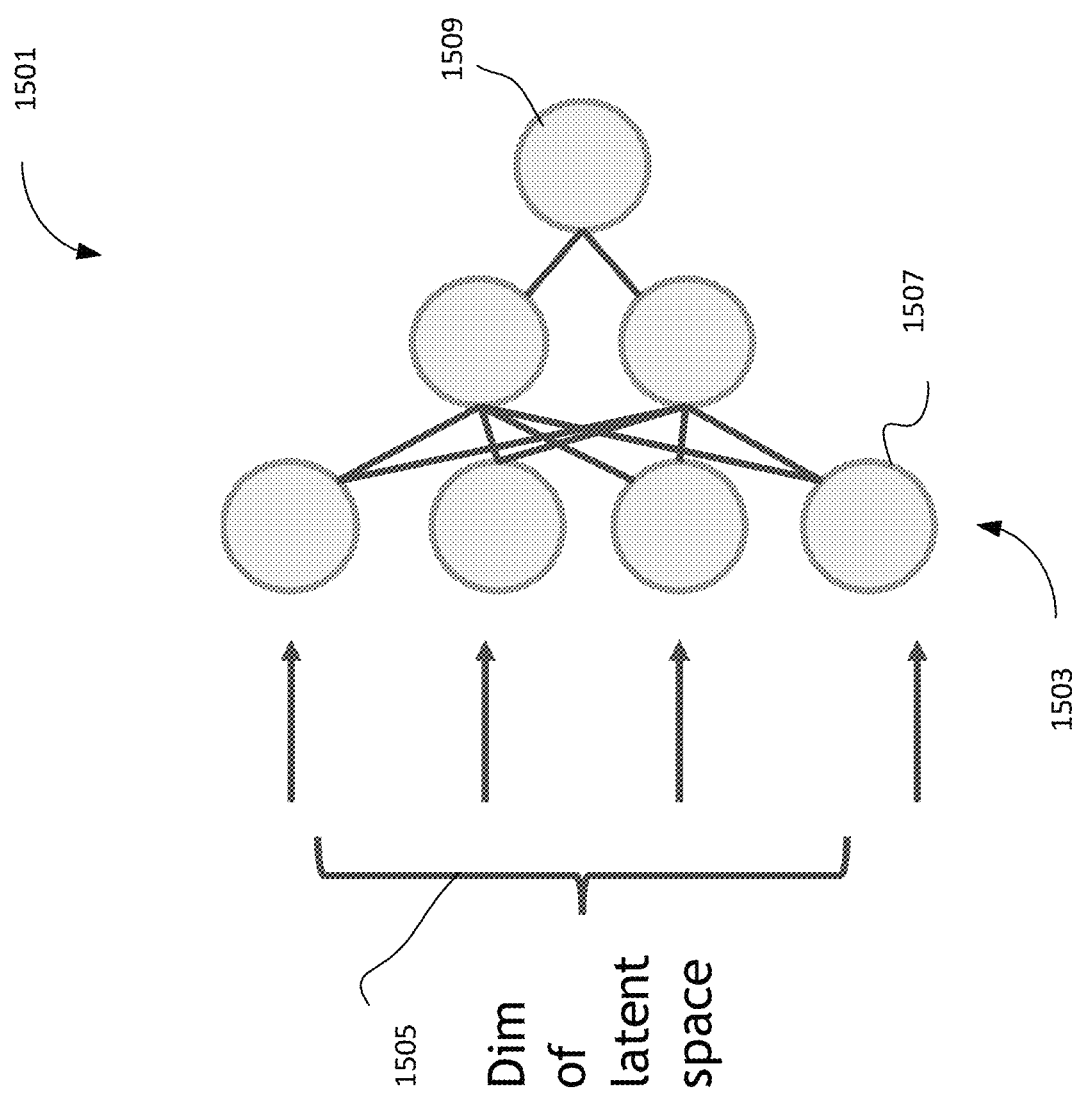
FIG. 15 illustrates a sample architecture of a neural network that may serve as a process settings machine learning model.

FIG. 15 illustrates a sample architecture of a neural network 1501 that may serve as a process settings machine learning model. As shown, model 1501 includes an input layer 1503 that has nodes 1505 configured to receive latent dimension data representing denoised large beam spot metrology information from a preprocessed wafer about to undergo processing.

In some implementations, input nodes are configured to receive additional or alternative information about the denoised large beam spot metrology information. For example, input nodes may be configured to receive input signal in the form of denoised spectra from large beam metrology sample points.

Input layer 1503 also has nodes 1507 configured to receive other preprocessed wafer data and/or process settings for the process being modeled. Examples of this additional input data are presented herein as examples of input data for the process settings model.

In some embodiments, the input layer includes separate nodes for many (e.g., at least about 50%) or all of the controllable position selective activation elements (e.g., heaters or antennas that may be separately activated to control the two-dimensional distribution of process parameter values) in an apparatus. Each such input node is dedicated to its own physical element. In some embodiments, the input layer includes a smaller group of nodes dedicated to receiving inputs for the controllable position selective activation elements. These nodes are flexible and receive input values of only the controllable activation elements that are proximate a region of the wafer being considered during execution of the model. In some embodiments, a model represents only a portion of a wafer's surface and that portion is adjustable based on the inputs applied to the model.

Model 1501 also has an output layer 1509 and one or more hidden layers 1511 (only one is shown in FIG. 15). Output layer 1509 comprises one or more nodes configured to present one or more wafer structure parameter values at one or more locations in the wafer under consideration and/or one or more process settings for applying to a process chamber that will process the preprocessed wafer for which the large beam metrology information was input to model 1501. In cases, where model 1501 is configured to output process settings, it may be designed so that input nodes do not receive process setting information, at least not process settings for the parameter that is output. For example, if model 1501 is configured to output temperature settings for heater elements in an array of such elements in a wafer chuck, the input nodes of model 1501 will not include these same temperature settings. However, some of the model inputs 1503 may be configured to receive other process parameter values such as chamber pressure, process gas flow conditions, and/or plasma conditions. In any case, the model may be configured to receive other inputs containing information about large beam metrology data on the preprocessed wafer.

Training a Process Settings Machine Learning Model
General Points

Training of a process settings machine learning model may be performed in various ways. In some implementations, the training is performed using supervised learning in which postprocessed wafer metrology values and/or wafer structure parameter values are used as tags. The training values associated with a tag may comprise information about preprocessed wafers and/or information about fixed process settings in the process being modeled (i.e., the process applied to the preprocessed wafer to produce the postprocessed wafer). Examples of the preprocessed wafer training information include information about large beam spot metrology performed on the wafer surface. Examples of fixed process settings of the process to be modeled include settings for one or more elements of a position selective activation component such as an array of heating cells in a wafer chuck. Other examples of fixed process settings include the overall chamber temperature and pressure during the process being modeled.

In some embodiments involving training with data about settings for individual elements of a position selective activation component, a training matrix is employed that includes, for individual postprocessed wafer metrology samples, only parameter setting values for the elements deemed likely to have a significant impact on the metrology sample tag (at the location of the sample). These may be elements within a region of influence identified for the location of the metrology sample.

Examples of Training Data

Figure 16:
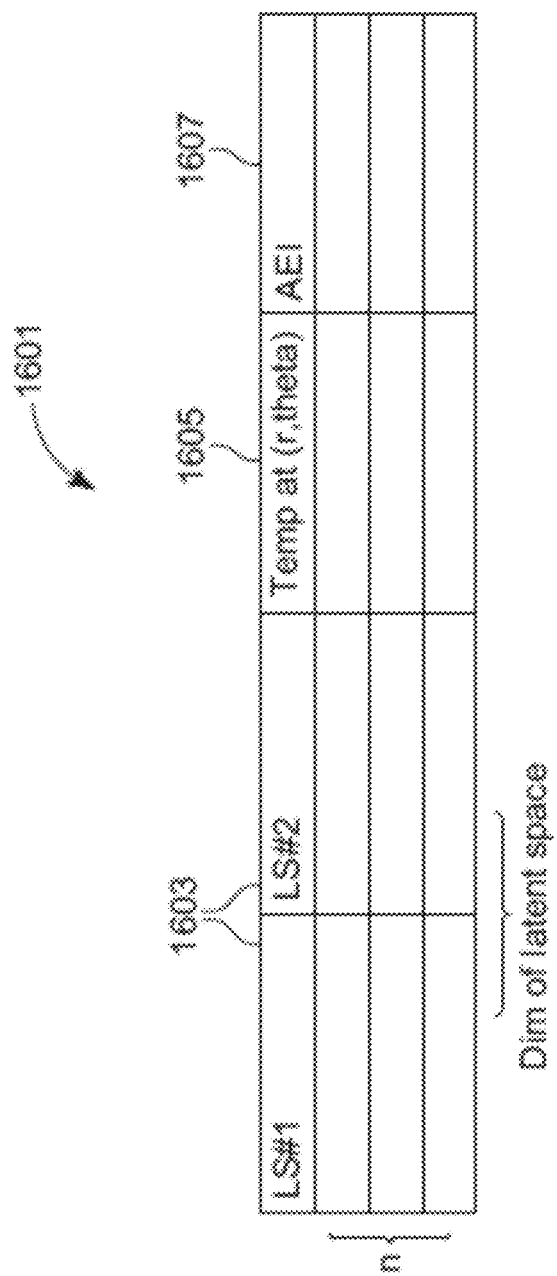
FIG. 16 depicts an embodiment in which training information is represented in a table that includes various training parameters, with each row optionally being provided for its own dimensional position on a wafer surface.

FIG. 16 depicts an embodiment in which training information is represented in a table 1601 that includes the following parameters, with each row optionally being provided for its own dimensional position on a wafer surface:

(a) preprocessed training wafer latent space values for each of two dimensions (LS #1 and LS #2 represented as 1603) for the position of a metrology spot on the training wafer (there may be more latent space dimensions not shown);

(b) a temperature value 1605 at the position of the metrology spot on the training wafer during processing the wafer with the process being modeled; and (c) the postprocessed wafer metrology value 1607 used as the tag for the training set member.

The latent space dimension values 1603 may be obtained from a denoising machine learning model that has received as input large beam spot metrology data over some portion of or the entire preprocessed wafer surface. The postprocessed wafer metrology value may be obtained using a high accuracy standalone metrology system.

FIG. 17 illustrates a training set 1733 for training a process settings model in accordance with certain embodiments of this disclosure. The disclosed training set is for supervised training using postprocessed wafer metrology sample values 1735 as tags (labelled "AEI" or after etch inspection) for training set members, each including a collection of parameter values that may influence local wafer structure parameters and/or the associated metrology values. Each wafer metrology sample value has its own row in the table depicting training set 1733. The elements in a row collectively define some or all the information in a training set member. Each training set member may include a tag—in this case the metrology sample value 1735 at a specific wafer position—and multiple associated parameter values.

In certain embodiments, the wafer metrology values 1735 are generated using a high accuracy and/or high-resolution metrology process such a small spot or standalone metrology tool. The metrology values may contain optical information such broadband reflectometry spectra or wafer structure parameter values such as geometric information about training wafer features and/or physical properties of one or more layers on the training wafer. Examples of suitable wafer metrology tools are discussed herein as tools for providing "supplemental" metrology in the denoising machine learning model section of this disclosure.

Each metrology value 1735 is taken at a unique two-dimensional position on a training wafer surface. Each metrology value (and associated row in the depicted table of training data) may have its own unique collection of parameter values. In some implementations, the parameter values of a training set member for any given metrology sample 1735 are limited based on the spatial location of the metrology sample on its training wafer surface. For example, a given metrology sample 1735 may have its own unique set of pedestal heating elements or cells that may influence the wafer structure parameter values at the location of the metrology sample.

Figure 18:
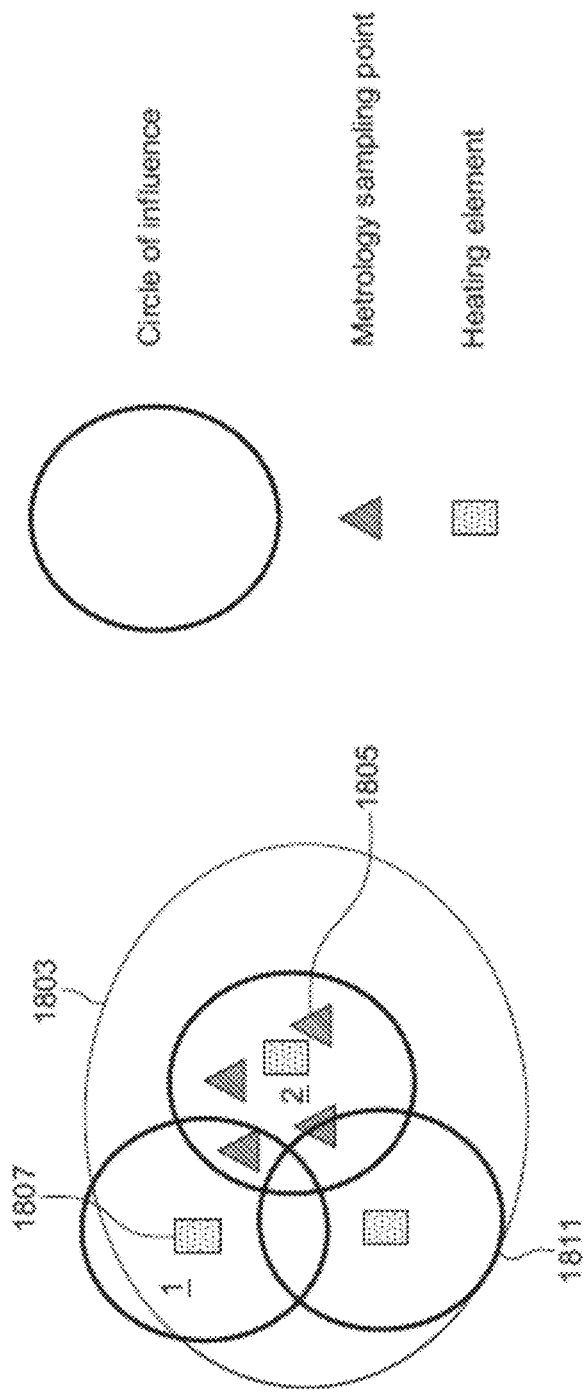
FIG. 18 illustrates an example training wafer, and, within the training wafer, there are various metrology sample locations and various heater element positions. The training wafer also includes a plurality of circles of influence, any of which may encircle or otherwise identify neighborhood groups heater elements on a wafer chuck having an array of heating elements.

FIGS. 16, 17, and 18 present examples in which the position selective activation component is a multi-heater component such as a wafer chuck. It should be understood, however, that in these examples the heater elements may be replaced or supplemented with other types of elements or selective wafer activation components. For example, some embodiments employ other types of position selective activation components such as components that control a two-dimensional distribution of plasma properties on the wafer surface or a two-dimensional distribution of gas flow properties on the wafer surface.

FIG. 18 illustrates an example training wafer 1803, and, within the training wafer, there are various metrology sample locations 1805 and various heater element positions 1807. Training wafer 1803 also includes a plurality of circles of influence 1811 any of which may encircle or otherwise identify neighborhood groups heater elements on a wafer chuck having an array of heating elements. The circles of influence may be chosen to group heating elements that collectively influence temperature values in particular regions of the wafer, e.g., regions containing locations of particular metrology samples used in training.

In certain embodiments, a region of influence is not bounded by a circle, but by a different shape such as an ellipse or a polygon. In certain embodiments, a region of interest has diameter, width, or other longest traversing dimension of about 5 to 100 mm or about 20 to 50 mm.

This grouping approach may be used as part of training over the entire wafer. By defining groups of heating elements or portions or a wafer (or chuck), the training may proceed relatively efficiently. The groups elements are treated together, optionally without considering possible influence from distant heating elements, for training. This is because distant heaters may have little impact on temperature at a given location. In some implementations, a heating element in the training set is set to 1 if it is in the circle; 0 if it is outside (i.e., it makes no contribution to the training influence of a metrology sample tag). In some embodiments, a region of interest is not binary, rather it defines a weighting of contributions of heating elements based, at least in part, on where those elements reside with respect to a metrology sample tag. For example, a radial or other region dimension may define the temperature impact of a heating element on distant locations on a training wafer. In certain embodiments, coefficients for linear or higher order weighting function (using distance variables) are used to parametrize the impact of a given heating element. This impact may be determined by calibration. In certain embodiments, the impact of a heating element may be determined using a separation distance or a spatial location (R, Θ) relative to a heating element by wave of a look-up table of temperature contributions.

In the depicted example, a given metrology sample position may belong to one, two, or three neighborhoods, each defined by its own circle of influence. In some embodiments, other arrangements of circles of influence (and hence neighborhoods) may be employed. The arrangements may have different degrees of overlap.

In the depicted embodiment, the circles of influence 1811 are fixed with respect to heater element locations (e.g., each circle of influence is defined by the location of a heater element). In this case, the location of the circle of influence is unvarying regardless of whether a metrology sample location is in the center or edge of a circle. In some embodiments, the location of a metrology sample defines its own circle of influence which determines the heating elements to include. These circles may, in some embodiments be defined by a radius and center. The center may be the location of the metrology sample. Either way, a circle of influence defines the heater elements to be considered with a training set element for a given metrology sample location.

As depicted, the rows of the table depicting training set 1733 include unique X and Y (or R and Θ) position values 1703 and 1705 of the metrology sample spot on the training wafer. Thus, for the first row of the table (a first training set member), the position of the associated AEI metrology value 1735 may be specified in the X and Y columns of the row.

It should be understood that FIG. 17 presents a subset of the training set members in training set 1733. If fully shown, the training matrix would optional include rows containing information for metrology samples in various regions of a training wafer that belong to multiple neighborhood matrixes. It should also be understood, that the training set members may be generated by performing metrology on one or a plurality of training wafers. In some implementations, the training wafers are preprocessed and/or processed using a range of process conditions defined by a design of experiment methodology. In some implementations, the preprocessed wafers contain spatial distributions of wafer structure parameter values set by a design of experiment methodology.

Training set 1733 may include various parameters that characterize the preprocessed training wafer used to provide the training set member information provided in a single row of training set table 1733. For example, it includes latent dimension values 1709*a*, *b*, and *c* that represent latent dimension values obtained from a denoising machine learning model that has processed as input large beam spot metrology data obtained from the training wafer used to create the training set member under consideration. Only three latent dimensions are shown in training set 1733, but in certain embodiments there are more latent space dimensions in the denoising model. Some or all of those latent dimensions may be represented in training set 1733.

As mentioned in connection with a description of denoising machine learning models, such models may be configured to project large beam spot metrology data into a latent dimension space. The resulting converted data in the latent dimension space may be represented as spatial models such as Zernike models. Whether or not the large beam spot metrology data from the training wafer is provided in the form a spatial model, values for that data, in latent space, at the location of the postprocessed metrology sample (1735) may be obtained from the denoising model and used to populate parameter fields 1709*a-c* in the training set. When using a spatial model of the latent dimension data, the training process may enter the two dimensional coordinates of the preprocessing metrology sample spot in the spatial model for the latent dimension under consideration and obtain value of the latent dimension reflecting the data that trained the denoising machine learning model.

Other parameters that characterize the preprocessed training wafer used to provide the training set member information provided in a single row of training set table 1733 include values associated with heating cells in the neighborhood of the metrology value of the training set member. A given training set member may have multiple heating cells in its neighborhood. In the depicted example, there are three of them. In some implementations, the training set table or matrix lists all heating cells but gives many of them a weighting of 0 because they are so far away from the location of the training data point that they are assumed to have not impact on the metrology value.

In the depicted embodiment, values associated with heating cells include temperature or heater control setting values 1713*a-c* and associated "impacts" of the corresponding heating cells 1741*a-c* in the neighborhood of the location of metrology sample for the row in question. The impact parameters 1741*a-c* may represent weighting contributions of the various heating cells in an array.

The setting values 1713*a-c* represent the temperatures or control parameters of heating cells of a multi-cell array in a wafer chuck, as set to produce the postprocessed training wafer. As indicated, in some embodiments, only a few of the heating elements in an array are included in any training set member. Those heating elements may be chosen based on a circle of influence or other technique for identifying those heating elements likely to have a significant impact on the metrology result. The setting values 1713 may be provided as a temperature value (e.g. 150° C.) or an input to the associate heating element that produces a desired temperature value. In some heating elements, the temperature is set by controlling the duty cycle of electrical power supplied to the element. Thus, for example, the percent values shown for temperature settings 1713 may reflect the duty cycle applied to the associated heating element while processing the training wafer. In the depicted embodiment, parameter values 1741*a-c* represent the impact of various heater cells based on their distances from the metrology sample spot of the training set member. The distance may be an actual physical distance or weighted or virtual distance that deviates from physical distance. The distances are not necessarily Euclidean distances. In some embodiments, the distance deviates from physical distance as a function of position on the training wafer. For example, heating cells proximate edge positions may have heating asymmetries. These asymmetries may be accounted for when determining distances. Hence distances between metrology spot locations and wafer heater positions may vary depending the locations of the metrology spot sample and the heater element. In some embodiments, training set distances between metrology sample positions and heating element positions is weighted in a way that makes them appear closer when one or both are near the periphery of the training wafer. Scaling may be determined by calibration, such as calibration at the factory where the chuck is manufactured.

As an example, a training set may include the following parameters:
 (a) unique x and y (or R and Θ) position values of the metrology sample spot on the training wafer;
 (b) notch orientation showing how the training wafer was arranged with respect to a wafer chuck when the wafer was subject to processing;
 (c) latent space values for each of multiple dimensions for the position of the metrology spot on the training wafer (there may be many latent space dimensions);
 (d) spatial hyperparameters representing distances between the metrology spot and individual heating cells in the pedestal used to process the training wafer;
 (e) temperature settings of each the heating cells in (d) during processing the wafer with the process being modeled; and
 (f) the postprocessed wafer metrology value used as the tag for the training set member.

In some examples, there are at most three separate heating cells that are considered in with any given metrology sample value. These may be deemed to influence the wafer structure parameter values at the location of the metrology sample. In some cases, they may be identified using a circle or other geometric region of influence.

Pedestal Temperature Spatial Model

In some embodiments, where the training data requires a wafer or pedestal temperature at the location where the metrology sample is taken (e.g., the training data in FIG. 16), the temperature may be determined using a temperature model that takes as inputs the various heater cell settings, which reside at fixed discrete points under the wafer, and outputs the temperature at any position on the wafer surface, regardless of whether the point coincides with the location of one of the heaters. Such models may be configured to account for thermal properties and geometries of heating cells, wafers, and/or support structures (e.g., chucks).

Point-by-Point vs Spatial Model

In certain embodiments, a process settings model is trained using wafer metrology or temperature values only as certain specified points on the wafer surface. The values at these points may be measured directly or derived using a spatial model that covers or interpolates to any point on the wafer surface, e.g., any point where supplemental, small beam spot, metrology may be conducted, particularly on the post-processed wafers. Note that supplemental metrology may be conducted at pre-set locations on a wafer surface, which may not correspond to the locations of the beam spots where signals are sampled for the large beam spot metrology.

In some embodiments, a process settings model is trained using wafer metrology and/or input parameter values in the form of a spatial model. Such model is used directly in the training, without regard to first calculating values at particular spatial points. A spatial model may employ a mathematical or other algorithmic representation of a parameter over the two-dimensional surface of a wafer. A Zernike decomposition or set of polynomials is one example of a spatial model. Any point on the two-dimensional surface can be probed for a parameter value by evaluating the mathematical/algorithmic representation of the parameter at the point in question. With a spatial model, a tool can interpolate to any point on the wafer surface.

Cost Function

A process settings model may be trained using a cost function such as a mean squared error (MSE) function for the multivariate training data. This approach uses a sum of weighted error over multiple dimensions. The multivariate information trained on may include multiple pieces of information about the wafer at sample points; e.g., CD and etch depth.

Further Embodiments

During the training phase, a system developer might not know which regions incoming wafers have large structure variations. Such regions may profit from fine (high resolution) scans or optical sampling. In certain embodiments, an outcome of the training phase, in addition to developing a within-wafer spatial model to capture variations, may include a sampling plan. In some implementations, a training procedure identifies the wafer regions (e.g., edge regions) that constitute the largest variations to be controlled which may call for focused, high-resolution, scanning to capture wafer structure details that might otherwise be missed due to high variation. This approach may provide improved accuracy and/or increased throughput as regions of a wafer surface that have not been identified as having significant structure variation may not require much fine control (e.g., though settings of a position selective activation components), and therefore can be more sparsely sampled in high volume production.

In certain embodiments, a process settings model is trained to recognize conditions that introduce defects and/or performance issues. The performance may be quantified in terms of electrical characteristics of devices, computational performance of dies or processing blocks, etc. Examples electrical performance criteria include resistance, capacitance, leakage current, electromigration, etc. In some implementations, the training wafers are processed over a range of conditions and the postprocessed wafers are evaluated using metrology in order to identify defects and/or in order to quantify performance. The results may include supplemental information such as defect types, spatial distribution of defects, and classes of defects, and types of electrical performance parameters. In some embodiments, the training takes place without using postprocessed wafer structure information such as spatial distributions of geometric parameters (CD, pitch, depth, sidewall angle, tilt, and/or overlay) or physical properties (e.g., n, k, and/or thickness) or metrology information presenting such parameters. In some embodiments, the process settings model is configured to output process conditions, including for example position selective activation element settings, that meet target defect and/or performance criteria for postprocessed wafers. Such process settings models may be configured to receive metrology scan information such as large beam spot metrology data for preprocessed wafers.

As explained for both process settings models and denoising models, the azimuthal orientation of a production or a training wafer with respect to a pedestal or beam orientation may be considered. Such relative orientation may indicate how a pattern or die is oriented in any given metrology sample, and such orientation information may be used to assist in training a model or using a model to predict process settings. The absolute orientation of a wafer can be impacted by many factors, including some that are purposefully included in fabrication technologies. In some cases, to protect certain components of a process apparatus, the wafer/chuck azimuthal orientation may be varied slightly between processing successive wafers in a batch. Such variations may be only slight, e.g., by a fraction of an angular degree to about 10 degrees. Regardless, in certain embodiments, these variations are recognized and transmitted to a model or to a pre-model data set up routine.

While the process settings machine learning models described herein have been described as being configured to receive denoised large beam spot metrology data, in some implementations other forms of metrology data may be used in addition to or as an alternative to denoised large beam spot metrology data collected from a preprocessed wafer. Unless otherwise precluded by context, process settings models described herein may be modified in these ways. In some embodiments, a process settings machine learning model is configured to receive raw or minimally processed metrology data. In some embodiments, a process settings machine learning model is configured to receive metrology data collected under conditions that minimize or account for contributions of periodic structures (patterns) to the metrology signal. In some implementations, the metrology data is provided with information about a design layout at the locations on the wafer where the metrology data is collected. In some cases, a baseline pattern contribution to metrology data is subtracted from the metrology signal before it is provided to a pattern setting model. In some embodiments, such as for example embodiments in which the metrology data is collected in a way that accounts for die/pattern contributions, a process settings model is implemented without having a denoising model first process the metrology data. In certain embodiments, a process settings model is configured to receive metrology data that does not qualify as large beam spot metrology data; e.g., small beam size or standalone metrology such as described as supplemental metrology herein.

In some embodiments, a relatively simple filter may be employed to capture positional variations in wafer structure parameter values. In some embodiments, pattern variations associated with wafer positions are learned or known a priori (e.g., form a design layout).

One example of a filtering method that uses learned information about spatial variations in patterns follows. To generate a filter, the system parks a broadband optical metrology sensor at a location on a patterned test wafer allows the wafer to spin. In some implementations, the test wafer contains little or no variation in process relevant parameters (e.g., layer thickness or CD). With each rotation, the sensor captures a periodic curve, and it may do so for each wavelength. Collectively, the signal versus time completely describes the wafer's pattern dependence at a particular value of R and/or $\ominus$.

The filter development may introduce a series test wafers (e.g., wafers produced using DOE) to produce R, $\ominus$ variations in process relevant parameters. For example, such test wafers may be produced using R, $\ominus$ pedestal temperature variations during fabrication. When such wafers are scanned using the broadband, large beam spot metrology tool (at a given value of R) the optical signal will capture differences from the baseline curve that reflects only wafer position dependent variations produced by the patterns. During operation, a system can be configured to subtract the reference baseline and leave a signal that can be directly correlated to the spatial variations in the process relevant parameter values on the incoming (for pre) or outcoming (for post) wafers. In some implementations, the filtered metrology signals are obtained for large beam spot metrology, and the filtered signals are used for training a process settings machine learning model.

Additional Considerations

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving toward adoption of 450 mm diameter substrates. The description herein uses the terms "front" and "back" to describe the different sides of a wafer substrate. It is understood that the front side is where most deposition and processing occurs, and where the semiconductor devices themselves are fabricated. The back side is the opposite side of the wafer, which typically experiences minimal or no processing during fabrication.

The flow rates and power levels provided herein are appropriate for processing on 300 mm substrate, unless otherwise specified. One of ordinary skill in the art would appreciate that these flows and power levels may be adjusted as necessary for substrates of other sizes. Much of this description presents examples using wafers. However, the disclosure is not so limited. The work piece may be of various shapes, sizes, and materials. In addition to semiconductor wafers, other work pieces may include various articles such as integrated circuit packages, displays, and the like.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A computational system configured to denoise optical metrology data, the computational system comprising instructions and/or data configured to implement a model comprising:
   (a) a plurality of input nodes configured to receive spectral components of optical metrology data collected from a plurality of beam spot positions on a wafer's surface; and
   (b) transformation logic configured to transform the spectral components into a latent space representation of the metrology data, wherein the transformation logic was trained to reduce noise due to lithographic patterns within the plurality of beam spot positions.

2. The computational system of claim 1, wherein the model comprises a neural network or autoencoder.

3. The computational system of claim 1, wherein the model comprises a variational autoencoder.

4. The computational system of claim 1, wherein the input nodes are configured to receive spatial indices representing the plurality of beam spot positions on the wafer's surface.

5. The computational system of claim 4, wherein the spatial indices indicate two-dimensional positions on the wafer's surface.

6. The computational system of claim 4, wherein the latent space representation of the metrology data comprises the spatial indices for the latent space representation of the metrology data.

7. The computational system of claim 1, wherein the system is further configured to transform the latent space representation to one or more spatial models of the latent space representation, wherein each spatial model presents information from the latent space representation as a function of position on the wafer's surface.

8. The computational system of claim 7, wherein the one or more spatial models comprise Zernike polynomials.

9. The computational system of claim 1, wherein the transformation logic is further configured to present the latent space representation of the spectral components as information comprising a central tendency of the metrology data in each of multiple dimensions of a latent space.

10. The computational system of claim 1, wherein the plurality of input nodes are configured to receive the spectral components having a first number of dimensions and wherein the latent space has a second number of dimensions, and wherein the first number of dimensions is greater than the second number of dimensions.

11. The computational system of claim 1, wherein the transformation logic is configured to reduce the contribution of pattern mixing to the metrology data.

12. The computational system of claim 1, further comprising other input nodes configured to receive information about a design layout of one or more fully or partially fabricated integrated circuits on the wafer.

13. The computational system of claim 1, wherein the model is configured to receive information about the relative locations and/or orientations of the lithographic patterns with respect to the beam spot positions.

14. The computational system of claim 1, wherein the plurality of input nodes is configured to receive the spectral components from beam spot positions of at least about 5 mm sample on the wafer's surface.

15. A computational system configured to determine process settings for a fabrication apparatus, the system comprising instructions and/or data configured to implement one or more models comprising:
   (a) a plurality of input nodes configured to receive a plurality of input parameter values characterizing a preprocessed wafer before the preprocessed wafer is processed in the fabrication apparatus, wherein at least a subset of the input parameters comprise information derived from optical metrology performed on the preprocessed wafer, wherein the optical metrology information comprises metrology samples collected over a portion of the preprocessed wafer's active surface; and (b) logic configured to computationally evaluate the plurality of input parameters and output (i) one or more process settings for the fabrication apparatus and/or (ii) a spatial distribution of one or more wafer structure parameter values over a postprocessed wafer's surface, wherein the postprocessed wafer is the preprocessed wafer after undergoing processing in the fabrication apparatus.

16. The computational system of claim 15, wherein the information derived from optical metrology comprises denoised optical metrology samples.

17. The computational system of claim 15, wherein the optical metrology comprises large beam spot optical metrology.

18. The computational system of claim 15, wherein the information derived from optical metrology comprises a spatial model of at least one characteristic of the information derived from optical metrology.

19. The computational system of claim 18, wherein the at least one characteristic comprises values from a dimension of latent space from a variational autoencoder configured to denoise optical metrology samples.

20. The computational system of claim 18, wherein the spatial model comprises Zernike polynomials.

21. The computational system of claim 15, wherein, when applied to the fabrication apparatus during processing of the preprocessed wafer, the one or more process settings produce the postprocessed wafer with a target spatial distribution of at least one of the one or more wafer structure parameter values over the postprocessed wafer's surface.

22. The computational system of claim 15, wherein at least one of the one or more models is trained using training information comprising settings of elements in a position selective activation component, and wherein data points in the training information employ only a fraction of the total elements in the position selective activation component.

23. The computational system of claim 15, wherein the plurality of input parameter values comprises values specifying process settings for the fabrication apparatus during processing of the preprocessed wafer.

24. The computational system of claim 15, wherein the plurality of input parameter values comprises settings for elements of a position selective activation component, and wherein the output of the logic comprises the spatial distribution of one or more wafer structure parameter values over a postprocessed wafer's surface, and wherein the distribution of one or more wafer structure parameter values is predicted by the one or more models to be provided on the postprocessed wafer when the preprocessed wafer is processed using the settings for elements of a position selective activation component received at the input nodes.

25. The computational system of 24, wherein the elements of the position selective activation component are heating elements in a chuck of the process chamber, and wherein the settings are temperature values produced by the chuck during operation, and/or inputs to the elements of the position selective activation component that produce the temperature values.

26. The computational system of 24, wherein the logic is further configured to identify a group of settings for the position selective activation component that will provide a target spatial distribution of wafer structure parameter values on the post processed wafer's surface.

27. The computational system of 26, wherein the logic is further configured to iteratively evaluate a cost function that compares the output spatial distribution of wafer structure parameter values on the postprocessed wafer's surface against a spatial distribution of the target wafer structure parameter values on the postprocessed wafer's surface.

28. The computational system of claim 15, wherein the plurality of input parameter values comprises a spatial temperature distribution on the preprocessed wafer's surface during processing in the fabrication apparatus.

29. The computational system of claim 15, further comprising a controller configured to apply the one or more process settings output by the logic, directly or indirectly, to the fabrication apparatus, and process the preprocessed wafer using the applied process conditions.

30. The computational system of 29, wherein the postprocessed wafer comprises an actual spatial distribution of the one or more wafer structure parameter values meeting a target distribution of wafer structure parameter values on the postprocessed wafer's surface.

* * * * *